United States Patent
Rigoni et al.

(10) Patent No.: US 12,348,027 B2
(45) Date of Patent: Jul. 1, 2025

(54) MULTI-FUNCTION CONTROL CIRCUIT AND PRE-CIRCUIT CONFIGURATION

(71) Applicant: Infineon Technologies Austria AG, Villach (AT)

(72) Inventors: Fabio Rigoni, Villach (AT); Giuseppe Bernacchia, Villach (AT)

(73) Assignee: Infineon Technologies Austria AG, Villach (AT)

( * ) Notice: Subject to any disclaimer, the term of this patent is extended or adjusted under 35 U.S.C. 154(b) by 282 days.

(21) Appl. No.: 17/903,510

(22) Filed: Sep. 6, 2022

(65) Prior Publication Data

US 2024/0079867 A1 Mar. 7, 2024

(51) Int. Cl.
*H02H 9/02* (2006.01)
*H02H 3/093* (2006.01)
*H03K 17/16* (2006.01)
*H03K 17/284* (2006.01)

(52) U.S. Cl.
CPC .............. *H02H 9/02* (2013.01); *H02H 3/093* (2013.01); *H03K 17/161* (2013.01); *H03K 17/284* (2013.01)

(58) Field of Classification Search
CPC ........ H02H 9/02; H02H 3/093; H03K 17/161; H03K 17/284
See application file for complete search history.

(56) References Cited

U.S. PATENT DOCUMENTS

| | | | | |
|---|---|---|---|---|
| 8,222,883 B2* | 7/2012 | Kraft | ........... | H02M 1/32 |
| | | | | 363/21.13 |
| 9,088,204 B2* | 7/2015 | Fang | ........... | H02M 1/08 |
| 10,587,199 B1* | 3/2020 | Chan | ........... | H02M 1/08 |
| 2022/0368225 A1* | 11/2022 | Zhou | ........... | H02M 3/158 |

OTHER PUBLICATIONS

Extended European Search Report, EP 23 19 4968, Feb. 1, 2024, pp. 1-8.
Li Yongyuan et al., "A 30-W 90% Efficiency Dual-Mode Controlled DC-DC Controller with Power Over Ethernet Interface for Power Device", IEEE Transactions on Very Large Scale Integration (VLSI) Systems, IEEE Service Center, Piscataway, NJ, USA, vol. 25, No. 6, Jun. 1, 2017, pp. 1943-1953, XP011650089.
Linear Technology, "Fast 150V Protected High Side NMOS Static Switch Driver", Linear Technology Corporation 2017, LTC7000/LTC7000-1, pp. 1-28, www.linear.com/LTC7000.

* cited by examiner

*Primary Examiner* — Gary L Laxton
(74) *Attorney, Agent, or Firm* — Armis IP Law, LLC

(57) ABSTRACT

An apparatus may include an input pin\ and timing control circuitry coupled to the input pin. The timing control circuitry selectively executes one or more timing control functions based on a set of one or more hardware components coupled to the input pin. The set of one or more hardware components are disposed external to the apparatus. A configuration of the set of one or more hardware components determines which of one or more of the multiple timing control functions are enabled.

29 Claims, 13 Drawing Sheets

MULTI-FUNCTION CONTROL CIRCUIT AND PRE-CIRCUIT CONFIGURATION

BACKGROUND

In the consumer power tool market, it is desirable to reduce the cost of goods as much as possible for the sake of keeping a product low in price. In the IC (Integrated Circuit) space, one of the components implemented in the power tool market is a switch driver. Typically, in addition to low cost, manufacturers often request small packaging to fit the corresponding circuit in their systems. For this reason alone, it is desirable that the number of pins in any circuit package be minimal.

In certain Load Switch applications, a customer may need to implement over-current protection. However, there may be a need to temporarily disable the over-current protection (such as via so-called blanking) during a startup condition and delay an overcurrent event that would needlessly trip based on startup noise.

BRIEF DESCRIPTION

As discussed herein, a circuit provides multiple different timer functions using a single pin. The user controls the different functions based on a pre-circuit configuration of an input pin. For example, as further discussed herein, the pre-circuit configuration controls one or more aspects of an applied input signal such as a magnitude of current inputted to a control pin, peak magnitude of voltage applied to a control pin, slew rate of a voltage inputted to a control pin, voltage discharge associated with the control pin, etc. Each of the aspects (parameters) circuit board used to control implementation of different timing functions of the control circuit. This gives the advantage for the customer of using a single pin for implementing multiple different timing control functions and providing a low pin count.

Accordingly, the present disclosure includes implementing multiple functions via a single pin of a circuit such as a semiconductor chip. The pin may support enable/disable capability as well as several timing configurations by using few external passive components, thereby extending design flexibility to a customer implementing the multiple functions.

More specifically, this disclosure includes an apparatus (such as controller circuit). The apparatus may include an input pin; and timing control circuitry coupled to the input pin, the timing control circuitry operative to selectively execute multiple timing control functions based on a set of one or more hardware components coupled to the input pin, the set of one or more hardware components being disposed external to the apparatus. A configuration of the set of one or more hardware components may select which of one or more of the multiple timing control functions are enabled.

As further discussed herein, one aspect of this disclosure is over-current protection. However, note that the different timing options as discussed herein can be used and distributed to any kind of functions implemented inside of a circuit (such as semiconductor chip, integrated circuit, etc.). As a more specific example, apart from an over-current protection enable technique as discussed herein, the blanking function as discussed herein can be used for under-voltage lockout blanking and the delay time could be used as startup retry delay.

The apparatus may include: i) a switch driver to control a switch, the switch disposed external to the apparatus; ii) a first comparator operative to control a first timing control function of the multiple timing control functions, the first timing control function operative to control disabling of over-current protection associated with driving the switch via the switch driver in accordance with a first threshold value inputted to the first comparator; and iii) a second comparator operative to control a second timing control function of the multiple timing control functions, the second timing control function operative to control disabling of over-current protection associated with driving the switch via the switch driver in accordance with a second threshold value inputted to the second comparator.

The first timing control function may control disabling of the over-current protection at startup; the second timing control function may control a time duration in which the magnitude of current through the switch is permitted to be above an over-current threshold level without over-current protection circuitry in the switch driver deactivating the switch subsequent to the startup condition.

Additionally, or alternatively, the timing control circuitry may include: a capacitor that is charged via current received through the input pin, the capacitor storing a voltage; and a comparator operative to compare a magnitude of the voltage stored in the capacitor to a threshold value, the output of the comparator operative to control at least one of the timing control functions as discussed herein. The capacitor may be charged during a condition in which an over-current protection provided by the apparatus is disabled; a magnitude of the current may be received through the input pin, a magnitude of which is defined (controlled) by the external set of one or more hardware components such as resistor.

Additionally, or alternatively, the timing control circuitry may implement fixed charging of a capacitor via constant current as a default condition to control the time duration TDELAY in which the magnitude of second current through a switch is permitted to be above the over-current threshold level without an over-current protection circuit initiating deactivation of the switch.

The set of one or more hardware components can be configured as or include any suitable hardware. For example, the set of one or more hardware components may include an RC filter comprising a first resistor and a first capacitor.

Yet further, the set of one or more hardware components providing configuration as described herein may include a diode in which to discharge a voltage at the input pin and turn off a timing control function.

The set of one or more hardware components can be configured as or include a filter that receives a control signal and supplies an analog control signal to the input pin to control selection of the multiple timing control functions.

The apparatus may further include an output pin as well as switch control circuitry. The switch control circuitry can be configured to output a control signal from the output pin to control, based on the selectively executed one or more multiple timing control functions, a switch disposed external to the apparatus.

The apparatus may take any suitable form. For example, the apparatus may be a semiconductor chip operative to control a state of a switch based on control input received through the input pin; the switch controlled by the apparatus may be disposed external to the apparatus.

Yet further, the timing control circuitry may execute the multiple timing control functions to control an external circuit (such as including the switch as previously discussed) with respect to the apparatus based on an input signal applied to the set of one or more hardware components (a.k.a. pre-circuit configuration) coupled to the input pin.

The multiple timing control functions controlled by the timing control circuitry may include any number of timing control functions. For example, the multiple timing control functions include a first timing control function controlled based on a magnitude of a voltage supplied by the set of one or more hardware components to the input pin; a second timing control function controlled based on a magnitude of first current supplied from the set of one or more hardware components through the input pin; and so on. The first timing control function (such as TB LANK) may control a duration of deactivation of an over-current protection circuit disposed in the apparatus. The second timing control function (such as TDELAY) may control a time duration in which the magnitude of second current through a switch is permitted to be above an over-current threshold level without the over-current protection circuit initiating deactivation of the switch.

In accordance with further examples as discussed herein, the timing control circuitry may include: i) first timing control circuitry to control a first time duration of deactivating an over-current protection circuit implemented by the apparatus to control a magnitude of current through a switch controlled by the apparatus; ii) second timing control circuitry operative to control a second time duration in which the magnitude of current through the switch is permitted to be above an over-current threshold level without deactivating the switch.

In yet a further example as discussed herein, a first timing control function of the multiple timing control functions may monitor a magnitude of voltage of a control signal received from the set of one or more hardware components at the input pin, the first timing control function operative to: i) enable operation of controlling a switch in response to detecting a first condition in which a magnitude of the control signal crosses a first threshold value; and ii) disable activation of an over-current protection circuit in the apparatus between a first instance of detecting the first condition and detecting that the magnitude of the control signal crosses a second threshold value.

As further discussed herein, this disclosure includes an assembly. The assembly may include a substrate and the apparatus and/or the set of one or more hardware components disposed on the substrate.

The apparatus and/or timing control circuitry as discussed herein may include: a capacitor that is charged via current received through the input pin, the capacitor storing a voltage; and a comparator operative to compare a magnitude of the voltage stored in the capacitor to a threshold value, the output of the comparator operative to control at least one of the timing control functions. The capacitor is charged during a condition in which an over-current protection provided by the apparatus is disabled; a magnitude of the current received through the input pin is controlled by the external set of one or more hardware components such as a resistor.

The set of one or more hardware components of the pre-circuit configuration may include a diode in which to discharge a voltage at the input pin and turn off a timing control function.

The apparatus may further include a switch driver to control a switch disposed external to the apparatus; a first comparator operative to control a first timing control function of the multiple timing control functions, the first timing control function operative to control disabling of over-current protection associated with driving the switch via the switch driver in accordance with a first threshold value inputted to the first comparator; and a second comparator operative to control a second timing control function of the multiple timing control functions, the second timing control function operative to control disabling of over-current protection associated with driving the switch via the switch driver in accordance with a second threshold value inputted to the second comparator. The first timing control function may control disabling of the over-current protection at startup; and the second timing control function may control a time duration in which the magnitude of current through the switch is permitted to be above an over-current threshold level without over-current protection circuitry in the switch driver deactivating the switch subsequent to the startup.

This disclosure further includes a switch control assembly. The switch control assembly may include a pre-circuit operative to generate an input control signal and a switch driver circuit. The switch driver circuit may include: i) an input pin to receive the input control signal from the pre-circuit, ii) an output pin to drive a switch with an output control signal based on the input control signal, and iii) timing control circuitry operative to selectively execute control functions in the switch driver circuit based on a configuration of the pre-circuit coupled to the input pin.

The pre-circuit produces the input control signal and may include: a series circuit path including a first resistor, a second resistor, and a capacitor disposed in series. A controller can be configured to input a control signal to the series circuit path; the control signal controls operation of the switch. A node couples the first resistor to the second resistor and supplies the input control signal to the input pin of the switch driver circuit. Settings of the first resistor, second resistor, and the capacitor control a first time duration of deactivating an over-current protection circuit implemented by the switch driver circuit to control a magnitude of current through the switch. A setting of the first resistor also controls a second time duration in which the magnitude of current through the switch is permitted to be above an over-current threshold level without the switch driver circuit deactivating the switch.

The pre-circuit of the switch control assembly may include further elements such as a circuit path including a resistor disposed between a switch controller (disposed external to the apparatus) and the input pin of the apparatus. The switch controller inputs a control signal to the resistor; the control signal controls operation of the switch. A setting of the resistor controls a time duration in which the magnitude of current through the switch is permitted to be above an over-current threshold level without over-current protection circuitry in the switch driver circuit deactivating the switch.

The switch control assembly as discussed herein may include: a capacitor and a comparator. The pre-circuit may include: a circuit path including a resistor disposed between a controller and the input pin. The controller inputs a control signal to the resistor; the control signal controls operation of the switch. A setting of the resistor controls a flow of current supplied through the input pin to the capacitor and TDELAY function; a voltage stored in the capacitor ramping based on the flow of current through the resistor; the comparator compares the voltage to a threshold voltage to determine a time duration in which the magnitude of current through the switch is permitted to be above an over-current threshold level without over-current protection circuitry in the switch driver circuit deactivating the switch.

Still further, the pre-circuit may include a diode in which to discharge the input pin.

The switch control assembly may include: i) a capacitor; ii) a comparator; the pre-circuit includes: a circuit path including a resistor disposed between a controller and the input pin, the controller operative to input a control signal to the resistor, the control signal controlling operation of the switch; and wherein a setting of the resistor controls a flow of current supplied through the input pin to the capacitor, a voltage stored in the capacitor ramping based on the flow of current through the resistor, the comparator comparing the voltage to a threshold voltage to determine a time duration in which the magnitude of current through the switch is permitted to be above an over-current threshold level without over-current protection circuitry in the switch driver circuit deactivating the switch.

The pre-circuit may include a diode in which to discharge the input pin. Yet a further example as discussed herein includes a method comprising: receiving an input control signal at an input pin of a semiconductor chip, the semiconductor chip including timing control circuitry coupled to the input pin; and based on the input control signal: i) selectively executing one or more multiple timing control functions of timing control circuitry based on a configuration of a pre-circuit supplying the input control signal to the input pin, and ii) producing an output control signal outputted from the semiconductor chip to control a state of a switch.

Note that this disclosure includes useful techniques. For example, in contrast to conventional techniques, the novel control as discussed herein enables control of many different functions depending on a configuration of a pre-circuit coupled to the input of the Applicant.

Note further that any of the resources as discussed herein can include one or more computerized devices, apparatus, hardware, etc., execute and/or support any or all of the method operations disclosed herein. In other words, one or more computerized devices or processors can be programmed and/or configured to operate as explained herein to carry out the different techniques as described herein.

Other aspects of the present disclosure include software programs and/or respective hardware to perform any of the operations summarized above and disclosed in detail below.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of techniques herein (BRIEF DESCRIPTION) purposefully does not specify every novel aspect of the present disclosure or claimed invention(s). Instead, this brief description only presents general aspects and corresponding points of novelty over conventional techniques. For additional details and/or possible perspectives (permutations) of the invention(s), the reader is directed to the Detailed Description section (which is a summary) and corresponding figures of the present disclosure as further discussed below.

Figure 1:
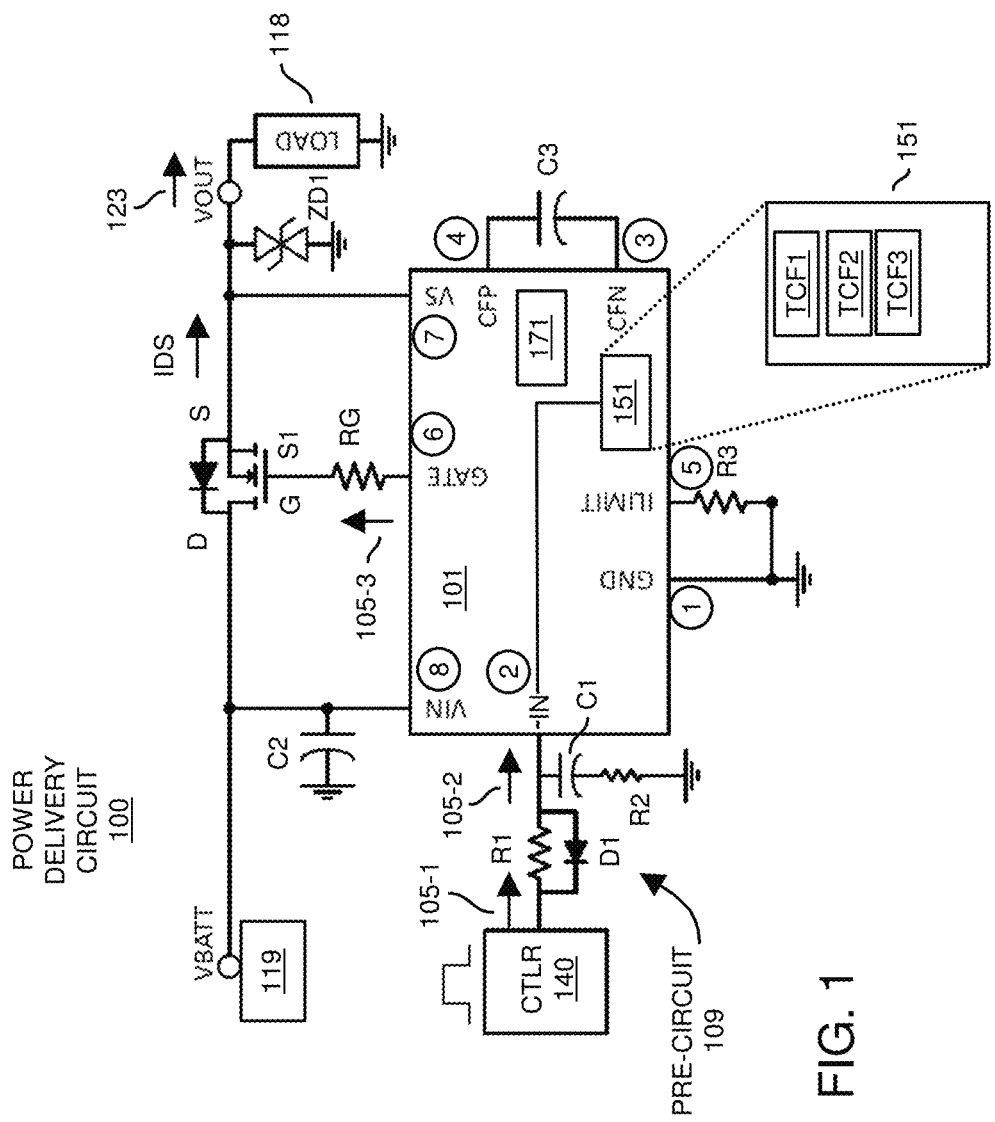
FIG. 1 is an example diagram illustrating a multi-function circuit as discussed herein.

The foregoing and other objects, features, and advantages of the disclosed matter herein will be apparent from the following more particular description herein, as illustrated in the accompanying drawings in which like reference characters refer to the same parts throughout the different views. The drawings are not necessarily to scale, with emphasis instead being placed upon illustrating the principles, concepts, aspects, techniques, etc.

DETAILED DESCRIPTION

As previously discussed, this disclosure is useful over conventional techniques. For example, in contrast to conventional techniques, a pre-circuit (external set of one or more hardware components) provides selection of a wide range of control functions.

As previously discussed, one aspect of this disclosure is over-current protection. However, note that the different timing options and implementations as discussed herein can be used and distributed to any kind of functions implemented inside of a circuit (such as semiconductor chip, integrated circuit, etc.). For example, apart from an overcurrent protection enable technique as discussed herein, the blanking function can be used for under-voltage lockout blanking and the delay time could be used as startup retry delay.

Now, more specifically, FIG. 1 is an example diagram illustrating a multi-function circuit as discussed herein.

As shown in FIG. 1, power delivery circuit 100 includes a battery resource producing the voltage VBATT, switch S1, resistor R1, resistor R2, resistor R3, capacitor C1, capacitor C2, capacitor C3, diode D1, zener diode ZD1, and load 118. Power delivery circuit 100 further includes circuit 101 (apparatus such as one or more semiconductor chips or discreet components of circuitry) operable to control the state of switch S1 and connectivity of the voltage VBATT to the load 118 based on the received input control signal 105-2.

Note that each of the resources as described herein can be instantiated in any suitable manner. For example, the controller 140 can be instantiated as or include hardware (such as circuitry), software (executable instructions), or a combination of hardware and software resources where applicable. Circuit 101 such as a controller 140 can be instantiated as or include hardware (such as circuitry), software (executable instructions), or a combination of hardware and software resources where applicable.

As further shown, the circuit 101 (such as an apparatus, controller, etc.) may include an input pin 2 and timing control circuitry 151 coupled to receive one or more signals from the input pin 2. The controller 140 generates the control signal 105-1 to control operation of switch S1. The pre-circuit 109 (a.k.a., timing control function selection circuit) including one or more of resistor R1, capacitor C1, resistor R2, diode D1, etc., converts or conditions the received input control signal 105-1 into the control signal 105-2 supplied to the input pin 2 of the circuit 101. The shaping and/or control of the control signal 105-1 by the pre-circuit 109 to produce the signal 105-2 controls operation of the circuit 101 and corresponding timing control circuitry 151.

As further discussed herein, in addition to controlling the switch S1 based upon the control signal 105-3, the circuit 101 implements timing control circuitry 151 that selectively executes multiple timing control functions TCF1, TCF2, TCF3, etc., based on a configuration of a set of one or more hardware components (such as resistor R1, resistor R2, diode D1, capacitor C1, etc.) coupled to the input pin 2 of (control) circuit 101.

As shown, the set of one or more hardware components in pre-circuit configuration 109 may be disposed external to the circuit 101. This allows a respective user to create an appropriate configuration of the pre-circuit configuration 109 to control the timing control circuitry 151. More specifically, a configuration of the set of one or more hardware components selects which of one or more of the multiple timing control functions TCF1 (such as over-current protection blanking time TB LANK in which over-current protection is disabled for a portion of time during startup), TCF2 (such as over-current protection delay time TDELAY in which over-current protection is disabled for short periods of time after startup), TCF3, etc., are enabled and implemented by the timing control circuitry 151.

As further discussed herein, the first timing control function TBLANK (such as TCF1) may be controlled based on a magnitude of a voltage (control signal 105-2) supplied by the set of one or more hardware components (i.e., pre-circuit configuration 109) to the input pin IN (2); the first timing control function TBLANK can be configured to control a duration of deactivation of an over-current protection circuit disposed in the circuit 101.

The second timing control function TDELAY (TCF2) can be configured to provide control based on a magnitude of first current supplied from the set of one or more hardware components through the input pin IN (2). The second timing control function TDELAY may control a time duration in which the magnitude of second current (such as current IDS) through the switch S1 is permitted to be above an over-current threshold level TL1 without the over-current protection circuit of circuit 101 initiating deactivation of the switch S1.

Note that the timing control functions can be implemented singly or in combination depending on a configuration of the pre-circuit 109. For example, a first configuration of the pre-circuit 109 supports implementation of the timing control function TCF1 only; a second configuration of the pre-circuit 109 supports implementation of the timing control function TCF2 only; a third configuration of the pre-circuit 109 supports implementation of a combination of the timing control function TCF1 and timing control function TCF2; and so on. As further discussed herein, setting of the components such as resistors, capacitors, etc., associated with the pre-circuit 109 controls attributes of the timing control functions implemented by the circuit 101 to produce the output signal 105-3.

More specifically, the circuit 101 such as a high-side gate driver provides fast turn on/off control of high side N-channel MOSFETs (such as switch S1) due to the powerful internal gate sourcing and sinking current capabilities provided by the circuit 101. The circuit 101 can be configured to include an integrated charge pump 171 with an external capacitor C3 to provide support of strong start-up and turn-off and scalable FETs in parallel application scenarios. The internal charge pump 171 allows providing proper MOSFET gate voltage (such as control signal 105-3 through gate resistor RG) during low operating input voltage conditions. So-called high-side protection as discussed herein avoids faulty shorting conditions in the load 118 and the dangerous presence of in-rush currents for battery-powered applications. Input voltage UVLO is provided to avoid the device (circuit 101) from operating under hazardous conditions and ensure the right level of gate voltage for the use of fully enhanced MOSFET.

Note further that the circuit 101 can be implemented in any suitable manner. For example, the circuit 101 can be configured as a DSO-8 package or other suitable entity including features of over-current protection, adjustable current setting threshold, time delay, as well as a safe start-up mechanism with flexible blanking during MOSFET turn-on transition.

As discussed herein, the timing control circuitry 151 of the circuit 101 is operative to execute one or more of the multiple timing control functions to control an external circuit (such as switch 151) with respect to the circuit 101 based on an input signal (control signal 105-1) applied to the set of one or more hardware components (pre-circuit configuration 109) coupled to the input pin IN. The circuit 101 (a.k.a., an apparatus) may be a semiconductor chip or other suitable entity operative to control a state of the switch S1 based on control input (such as control signals 105-1 and 105-2) received through the input pin IN. For example, circuit 101 includes an output pin 6 and switch control circuitry (such as driver 202 in FIG. 2) operative to output a control signal 105-3 from the output pin (GATE) to control, based on the selectively executed one or more multiple timing control functions TCF1, TCF2, etc., a switch S1 disposed external to the circuit 101. The switch S1 may be disposed internal or external to the circuit 101.

If desired, the system as discussed herein includes an assembly such as including: a substrate (such as a circuit board) and pre-circuit configuration 109 (set of one or more hardware components) disposed on the substrate.

More specifically, the circuit 101 (such as gate driver) may integrate as well provide one or more protection features such as:
  Main supply voltage UVLO (Under Voltage Low)
  Over Current Protection (OCP) with programmable threshold via resistor or analog signal
  Safe start-up to the disconnect switch with blanking of OCP
  Overcurrent protection latch-off and externally adjustable time delay for more flexibility
  Pin 1-GND Device ground connection
  Pin 2-IN Enable control for the main disconnect switch S1 and power up of circuit 101

Pin 3-CFN Bottom terminal of the flying capacitor C3
Pin 4-CFP Top terminal of the flying capacitor C3
Pin 5-ILIMIT Set OCP (over-current protection) threshold via pull-down resistor. Short to GND to disable OCP function
Pin 6-GATE Gate outputs control signal 105-3 of the gate driver (switch S1)
Pin 7-VS System output voltage. Connected to source of disconnect switch S1
Pin 8-VIN Chip supply. Connected to drain of disconnect switch S1

In many power applications including motor drives and SMPS, the supply architecture often requires that different modules can be disconnected from the main supply rail when a malfunction occurs on one of those modules. In order to achieve that functionality, it is common to use high side disconnect switches (e.g., MOSFET) that isolate the module causing the fault from the main rail. In a battery powered motor drive system for instance, the battery (such as providing VBATT) is typically connected to the main inverter via a disconnect switch (such as S1). The switch S1 avoids that a short in the load 118 causes a short in the battery (producing VBATT), an event that may lead to a fatal error or even battery destruction.

Another behavior that takes place in such systems is the presence of in-rush currents. In-rush current is the current that flows from the main supply or battery 119 (producing VBATT) through the disconnect switch S1 to the modules (such as load 118), basically to start charging the bus capacitors in those systems for the first time. In other words, load 118 may include many capacitors. In the battery powered drive example, in-rush current happens when the battery 119 is connected for the first time to the load 118 (such as inverter) and sees a low impedance path to the fully discharged bus capacitors in the load 118. This occurs when the disconnect switch S1 is initially turned on. The current (IDS) through switch S1 can increase to dangerous levels and even destroy circuitry (such as elements in the applications) for example when the SOA (Safe Operating Area) of the disconnect switch S1 is violated. For that reason, a controlled charge function can help mitigate or prevent circuit damage.

In order to control the high side disconnect switch S1, the high side gate driver (such as circuit 101) is implemented. The gate driver producing signal 105-3 addresses two main use cases in these systems such as:
1. Inrush current control: allows controlled turn-on of the disconnect switch by using an external Rg combined with a safe start-up and blanking mechanism to control a magnitude of current IDS.
2. Short circuit protection: whenever a short occurs at the load side, the circuit 101 disconnects the load 118 from the source (119) by quickly turning off the disconnect switch S1. This is made possible by the strong pull-down function inside the circuit 101, therefore protecting the whole system The low output impedance of the gate driver (producing signal 105-3) and integrated into circuit 101 allows optimization of start-up and turnoff of switch S1 by using an external resistors-diode network between the driver's output and the gate (G) of the switch S1 (such as MOSFET). The gate driver signal 105-3 may be supplied via a charge pump 171 and allow fast start up based on external flying capacitor C3. The charge pump 171 may allow, of course, to run the high side gate driver in 100% operation which is necessary for driving a high side switch S1. The charge pump 171 may also support low input voltage operation yet maintaining enough voltage at the gate driver output. For example, this can be achieved via the combination of two charge pumps: 1. a first charge pump using an external capacitor (fast charging of VCC cap, support charging of MOSFET, doubler charge pump) and 2. another charge pump internally implemented with ultra-low power capability allowing it be always connected to the battery rail. (e.g., a tripler charge pump may sustain low input VIN, maintain charge flow during the active state of main disconnect switch).

Figure 2:
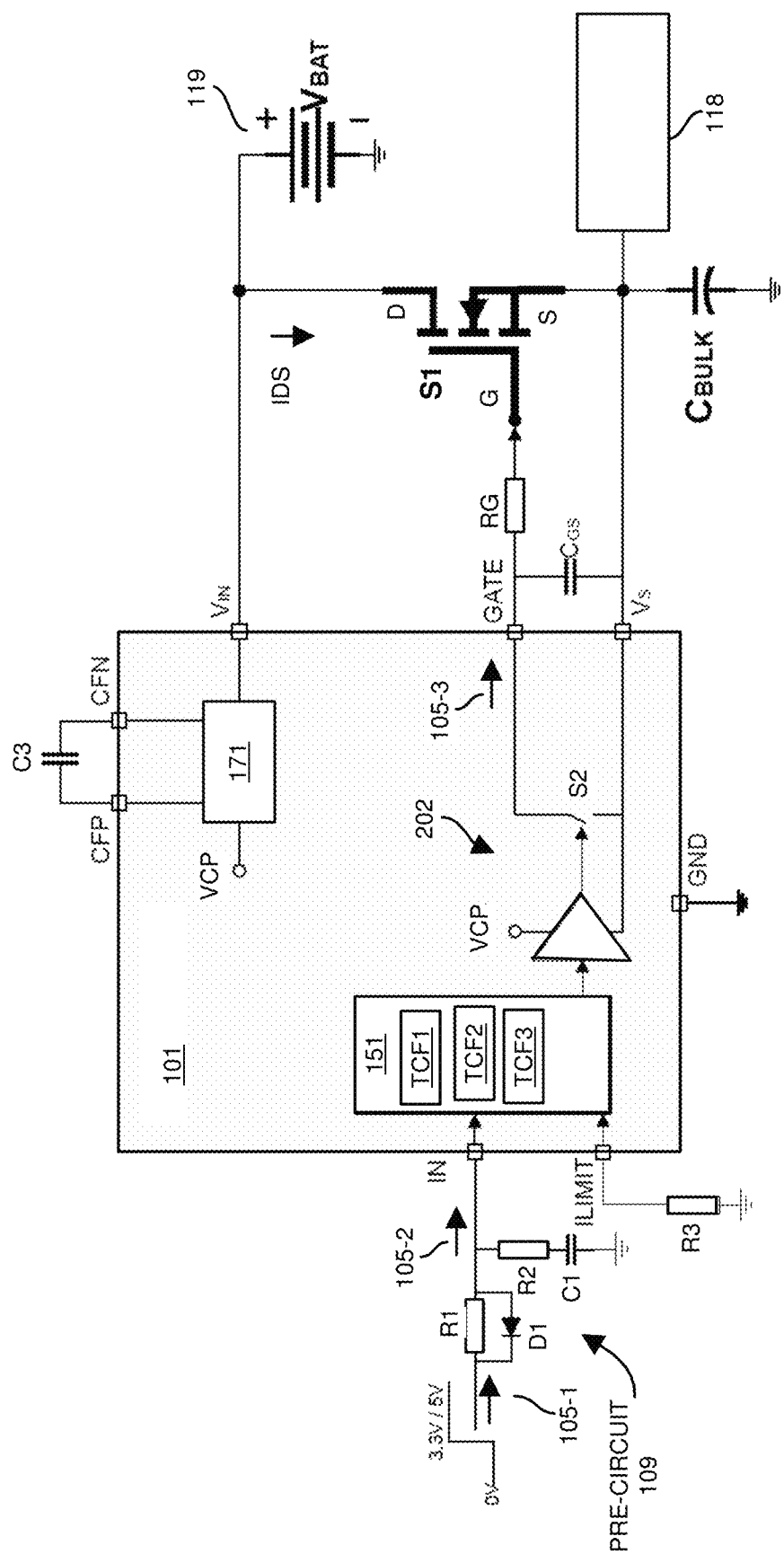
FIG. 2 is an example more detailed functional block diagram of a multi-function control circuit as discussed herein.

FIG. 2 is an example detailed functional block diagram of a circuit as discussed herein.

Description of IN Pin (PIN 2)

The IN pin is the input to the gate driver 202 and controls the turn-on and turn-off of the main disconnect switch.

The IN pin is also a multi-function pin that provides following functions:
1. IN controls the startup of the device:
    If VIN<VTHHIN (where VTHHIN is around 1.2 VDC), the circuit 101 is in the OFF state, corresponding to the lowest current consumption. In this case, all internal circuits are not functional.
    If VIN>VTHHIN, first the internal circuits are turned ON. Second, the VIN UVLO is checked for proper operating voltage.
2. IN is the control signal for the gate driver
3. IN pin with external RC circuit provides flexible over-current protection blanking (TB LANK) during start up to avoid tripping OCP (over current protection) and resistor divider circuit can also provide a programmable time delay (TDELAY) to OVER-CURRENT PROTECTION (OCP) tripping event.

When the control signal 105-1 is set to a logic low (such as around 0 volts DC), the circuit 101 controls the switch S1 to an off state. The control signal 105-was sent to a logic high (such as 3.3 VDC, 5 VDC, etc.), the circuit 101 controls switch S1 to an ON-state depending on the pre-circuit 109 controlling implementation of one or more different timing control functions implemented by the circuit 101 as further discussed herein. For example, circuit 101 implements one or more timing control functions 151 to produce control signal 105-3 via control of switch S2. Shorting of switch S2 of the driver 202 sets the switch to an OFF-state. Opening of switch S2 of the driver 202 causes the switch S1 to be turned ON.

As discussed herein, the circuit 101 provides multiple different timer functions using a single pin (IN). The user controls the different functions based on a pre-circuit configuration of an input pin. For example, as further discussed herein, the pre-circuit configuration 109 controls one or more aspects of an applied input signal (control signal 105-1, control signal 105-2) such as a magnitude of current inputted to the input pin IN, peak magnitude of voltage associated with the control signal 105-2 applied to the input pin IN, slew rate or change in magnitude of a voltage of control signal 105-2 inputted to the input pin IN, voltage discharge associated with the control signal 105-2 via diode D1, etc. Each of the aspects (parameters) circuit board used to control implementation of different timing functions of the control circuit.

Figure 3:
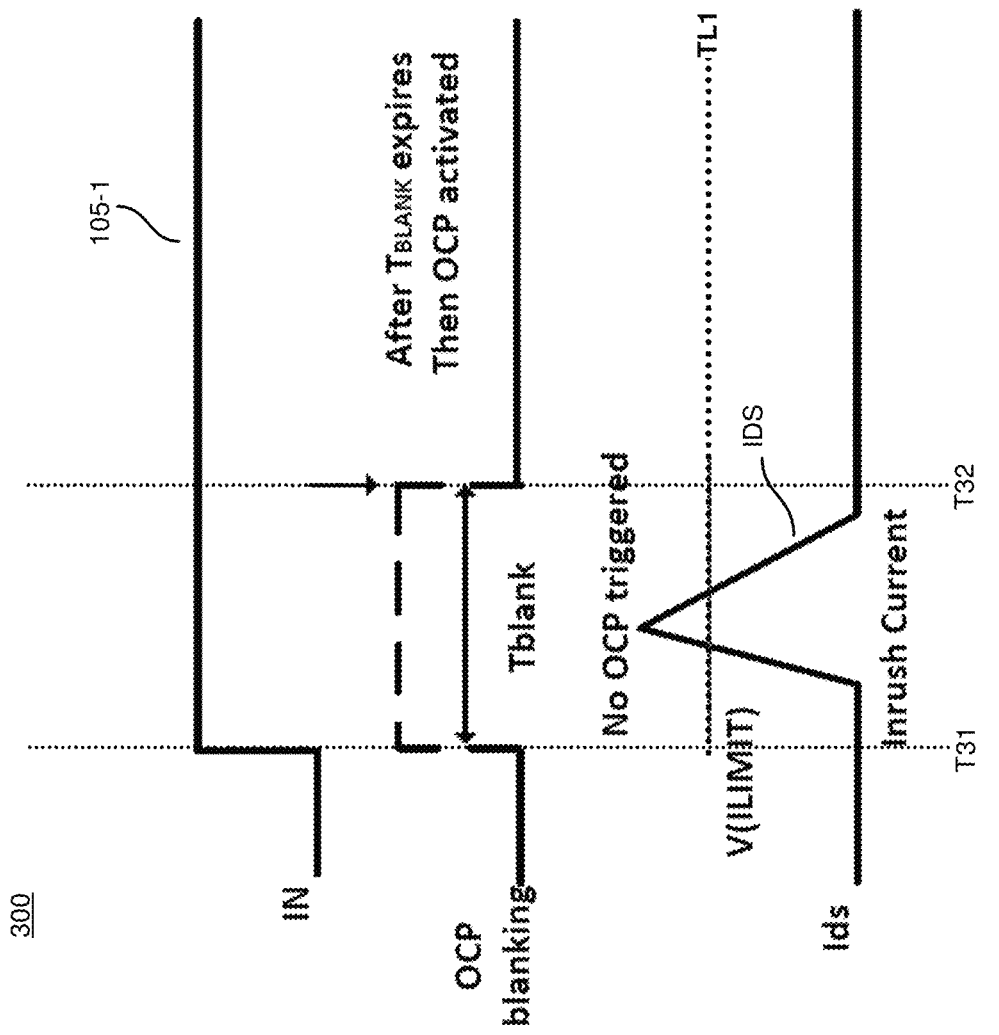
FIG. 3 is an example timing diagram illustrating safe startup with over-current protection blanking as discussed herein.

FIG. 3 is an example timing diagram illustrating safe startup with over-current protection blanking as discussed herein. More specifically, FIG. 3 illustrates safe start up and so-called OCP blanking. Over-current protection (OCP) blanking indicates a mode in which over-current protection and tripping is temporarily disabled during startup.

In order to start up the circuit 101, the following conditions are observed:

IN pin
VIN UVLO

As shown in graph 300, a normal start-up sequence should meet various input conditions. Firstly, the startup is initiated with command of IN voltage above VTHHIN. When input voltage VIN (at pin 8 of the circuit 101) is above VIN UVLO, POR (processor on reset) is asserted and the circuit 101 (such as an Integrated Circuit) is fully functional. At the same time, it rises the charge pump voltage supply and provides enough voltage above VIN, so that the GATE pin 6 can provide sourcing current with desired gate voltage. Then the switch S1 will be turned on and connect the battery power supply VBATT to the load 118.

To provide a safe start-up function, note that it is possible to adjust the OCP blanking time (a.k.a., TBLANK) by using an external RC network (filter or pre-circuit configuration 109) connected to pin IN (a.k.a., pin2). This way, no OCP event is triggered during the S1 turn-on phase until the blanking time is expired. If the system as discussed herein has pre-charge circuit, then the main disconnect switch S1 can be turned on faster, therefore a faster blanking time TBLANK can be designed and provided by the smaller settings of RC (resistor R1, resistor R2, capacitor C1) components. If the system has a no-precharge circuit, then a longer blanking time TBLANK is also achievable by selecting a larger capacitor value (C1) on IN pin.

After blanking time such as when TBLANK has expired, it means the system has successfully started up as VDS voltage transitions from cut-off, through the high ohmic region, and into a fully enhanced turned-on region. Then OCP is activated. RC components are to be connected to the IN pin 2 if the OCP function is planned to be used. In case of no RC components, the user implementing power converter 109 needs to ensure ILIMIT pin is grounded, so that it will not create an OCP event at all during start up.

Thus, in the example of FIG. 3, the control signal 105-1 is switched from a logic low to a logic high at time T31 to turn on switch S1. The circuit 101 implements so-called blanking time TBLANK between time T31 and time T32 to prevent their respective overcurrent condition associated with current IDS through the switch S1. As previously discussed, the settings of the pre-circuit 109 control a duration of TBLANK, which is measured starting from time T31 when the control signal 105-1 goes to a logic high. As further shown in FIG. 3, the circuit 101 may detect that the current IDS through the switch S1 is greater than the threshold limit TL1 during the blanking time TBLANK between time T31 and T32. However, because the overcurrent protection is deactivated via circuit 101 during the time duration TBLANK, the circuit 101 does not shut off the switch S1 to limit the inrush current IDS. However, after time T32, the circuit 101 implements overcurrent protection by monitoring a magnitude of the current IDS and opens the switch S1 in response to detecting a condition in which the current IDS is greater than the threshold level TL1.

Figure 4:
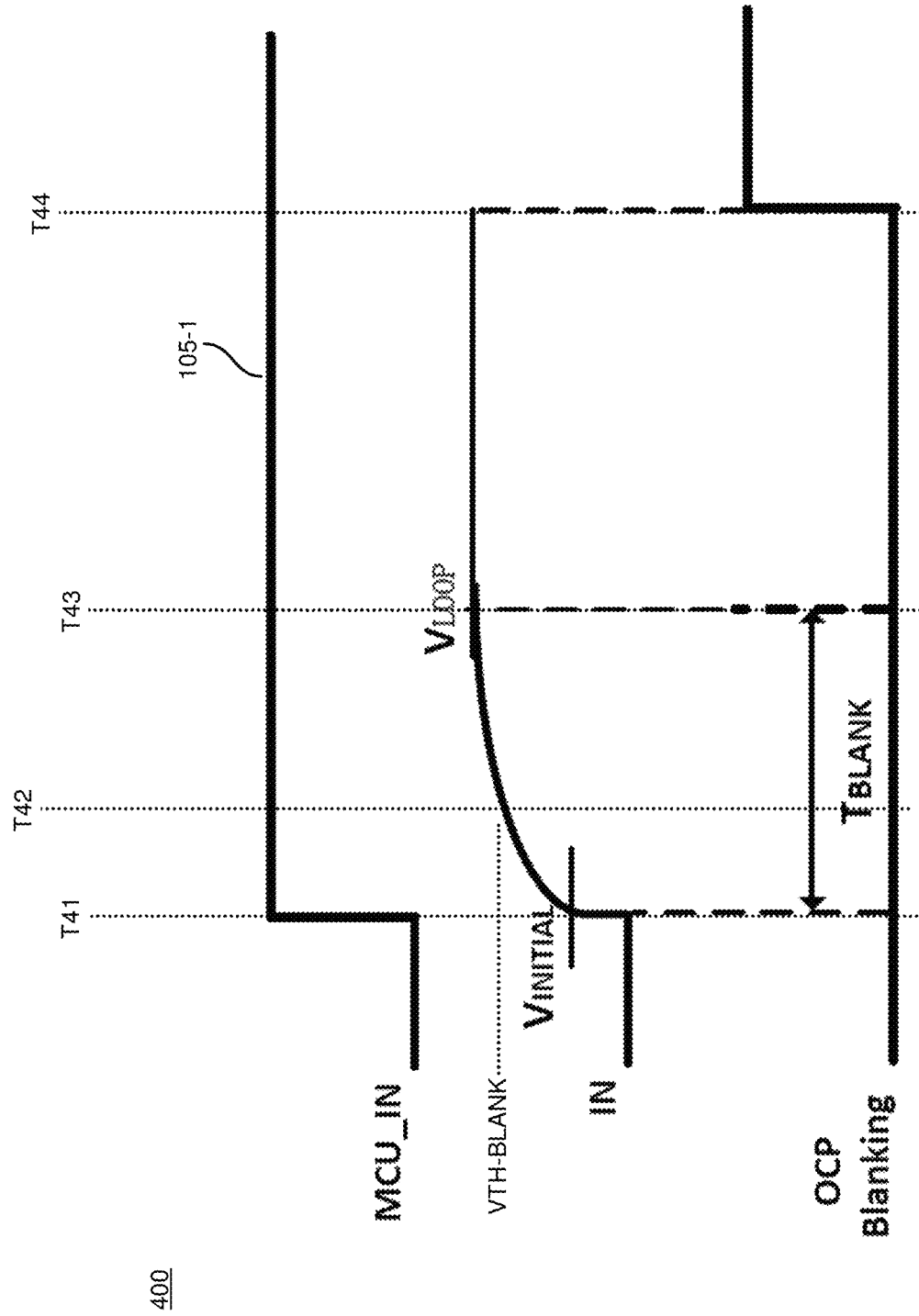
FIG. 4 is an example timing diagram illustrating overcurrent protection blanking time set up as discussed herein.

FIG. 4 is an example timing diagram illustrating overcurrent protection blanking time set up as discussed herein. More specifically, the device turn-on and OCP blanking time diagram is shown in FIG. 4.

In this example, the user implements R1, R2, and C1 in the pre-circuit configuration 109 to control the different timing control functions (such as TBLANK).

In accordance with further examples such as graph 400, the OCP blanking time TBLANK is controlled via settings of pre-circuit 109 and corresponding external passive components R1, R2, and C1. R2 will need to be R1/2.5 when pin IN voltage from MCU (microcontroller unit or controller 140) is 5V or equal to R1 when IN is 3.3V. As shown, the RC filter network of the pre-circuit 109 will create an initial jump of the IN pin voltage to the value VINITIAL. This level must be set high enough to cross the VTHHIN threshold and start the operation of circuit 101 (such as chip). Capacitor C1 is used to tune the blanking time TBLANK. With selected RC components, the RC (pre-circuit configuration 109) defines the desired blanking time it takes from the initial jump voltage VINITIAL to the IN Pin OCP Delay Threshold VLOOP as shown in other FIGS.

The blanking time TBLANK may be calculated in the equation as time parameter t:

$$VLOOP = VINITIAL + (VFINAL - VINITIAL) * (1 - e^{-t/\tau})$$

Hence TBLANK is equal to: $T*[\ln(VFINAL-VINITIAL)-\ln(VFINAL-VLOOP)]$, where VLOOP is blanking time voltage threshold on IN pin as 2.5V, VFINAL is IN pin voltage from control input either 5V or 3.3V and $T=(R2+R1//RRPD)*C1$, RPD is internal pull-down high impedance resistor, RRPD is a setting instance of the resistor RPD. (See resistor RPD in FIG. 6).

For example, when the ctrl 140 input voltage (control signal 105-2) on IN pin is 5V as VFINAL, if the value of R1 is 16 kΩ (minimum requirement defined by pin current consumption), R2 is calculated as 6.4 kΩ from the above description. Therefore VINTIAL is the initial voltage 1.43V based on the selection of R1 and R2. If C1 is chosen with value of 0.2 µF, TBLANK time would typically be 1.6 mS and when the C1 value is 20 nF, TBLANK time is 10 µS.

Figure 5:
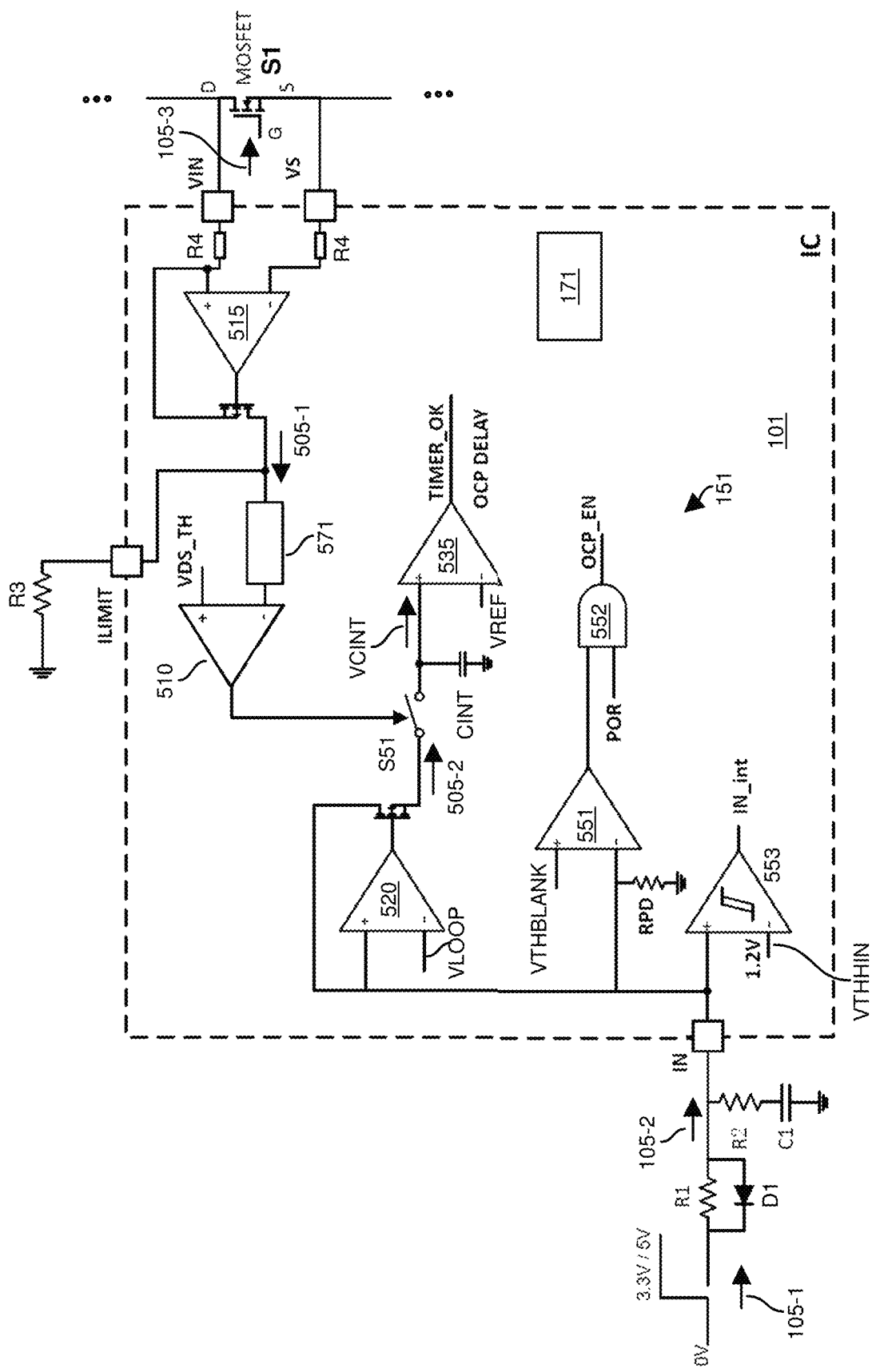
FIG. 5 is an example circuit diagram illustrating flexible overcurrent protection time delay and overcurrent protection blanking functions as discussed herein.

FIG. 5 is an example circuit diagram illustrating flexible overcurrent protection time delay and overcurrent protection blanking functions as discussed herein. More specifically, the overall OCP internal function blocks and programmed time delay block diagram are shown in FIG. 5. Note that the discussion below refers to a combination of FIGS. 1, 2, and 5.

The gate driver 202 producing control signal 105-3 controls the gate node (G) of the disconnect switch S1.

The driver producing communication settings 105-3 comes with sourcing and sinking currents outputs:

Sourcing current: directly provided by the charge pump 171.

Sinking current: when activated, it shorts the gate of the disconnect switch to its source.

A user may optimize the turn-on and turn-off switching behaviors by usage of external components like RG gate resistors and antiparallel diodes. For example, the pre-circuit configuration 109 (a.k.a., pre-circuit) may include a diode D1 in which to discharge the input pin.

In order to avoid an undefined state of the gate of switch S1 during off state due to other circuitry switching, an active clamp mechanism can be integrated into the gate driver 202 that produces the control signal 105-3. The active clamp circuit ensures a proper clamping of the driver 202 output when no supply voltage is applied to the driver and will deactivate as soon as the pull-up gate driver is turned on.

As previously discussed, the supply voltage for the gate driver 202 is provided by a charge pump 171 with an external flying capacitor C3 connected at pins CFP and CFN. The output of the charge pump 171 is available at pin GATE to provide direct sourcing current. An external capacitor CGS (see FIG. 2) can be placed between pins GATE and VS (source of the disconnect switch) to work in parallel to the input capacitance of the switch S1. The charge pump 171 allows driving the proper gate voltage (via control signal 105-3) at any operating condition. The CGS capacitor may be chosen to provide low voltage ripple upon fast turn-on of the disconnect switch S1. It is recommended to select CGS≥10CG, where CG is the equivalent gate capacitance of the disconnect switch S1.

The charge pump 171 is enabled as soon as pin IN is set HIGH.

The main reason for having an external flying capacitor C3 is the possibility to achieve a fast start up by properly sizing the flying capacitor C3 with regard to the CGS capacitor. Such implementation of adding external capacitors allows the user implementing circuit 100 to maintain low ripple voltage at VGS independently from the start up, due to the fact that the charge pump 171 is loaded with high load only when the disconnect switch is turned ON. After that, the loading is only provided by the biasing current of the internal circuitry.

In further examples, the circuit 101 may integrate a Vds sense feature that allows the device (circuit 101) to both react in a safe way to OCP events with a certain time delay and also provide an analog signal of amplified Vdson voltage. It includes a Vds fault comparator 510 that is used to trigger over-current shutdown events by monitoring the voltage difference between VIN and VS pins. The signal on ILIMIT pin can be measured by a microcontroller via an Analog to Digital Converter for different purposes, for example, current monitoring.

Features of the Vds sensor: Vds sensing module can be really flexible depending on what the application needs as it contains the list of features below:
- Amplification stage with possible analog reading through ILIMIT pin
- External gain setting via R3 resistor with flexible current triggering values
- Configurable OCP filter delay via R1, R2 to filter out possible system noise Activation of Vds Sensor (OCP and Current Monitoring)

Via amplifier circuit 515, the circuit 101 monitors the voltage difference between VIN and VS pins which is actually the voltage across Rds(on) minus the threshold voltage set by external resistor R3 on the ILIMIT pin. The resistor R3 between ILIMIT pin and GND is used to set the gain of the amplification stage. When the signal 505-1 is greater than the threshold level VDS_TH, the circuit 101 turns on the switch S51. This causes the output of the circuit 520 to charge the capacitor CINT via current 505-2. Resistor R1 controls a magnitude of the current 505-2 to charge capacitor CINT.

The voltage VCINT of capacitor CINT is compared to the threshold level VREF. If such voltage difference in terms of the excessive current level is greater than Vds comparator threshold VREF, this comparator 535 will go logic high. As further discussed herein, if the current IDS is greater than the threshold level TL1 for more than a time duration TDELAY, the circuit 101 triggers the OCP protection that switches off the switch S1. The analog signal monitoring on ILIMIT PIN is active from a time of the start-up of the device.

Note that the OCP function is only activated after blanking time TBLANK expires or no blanking time at all. In other words, over-current protection and shut off of switch S1 is disabled during TB LANK.

Pins required for Vdson sensing and OCP delay are
- VIN: MOSFET drain pin. Connected on the PCB to VIN as close as possible to the drain of the disconnect switch S1
- VS: MOSFET source pin. Connected on the PCB as close as possible to the source of the disconnect switch S1.
- ILIMIT: R3 resistor on the pin defines the amplifier gain. This pin also holds the analog signal proportional to the Vdson voltage. If ILIMIT is pulled down to GND, the Vds sensor is deactivated.
- IN: IN pin not only provides chip enable function but also OCP time delay value through external resistor R1, R2 on IN pin. For these purposes, customers can decide how long the OCP event will be present in the system before it is acknowledged as a fault.

Figure 6:
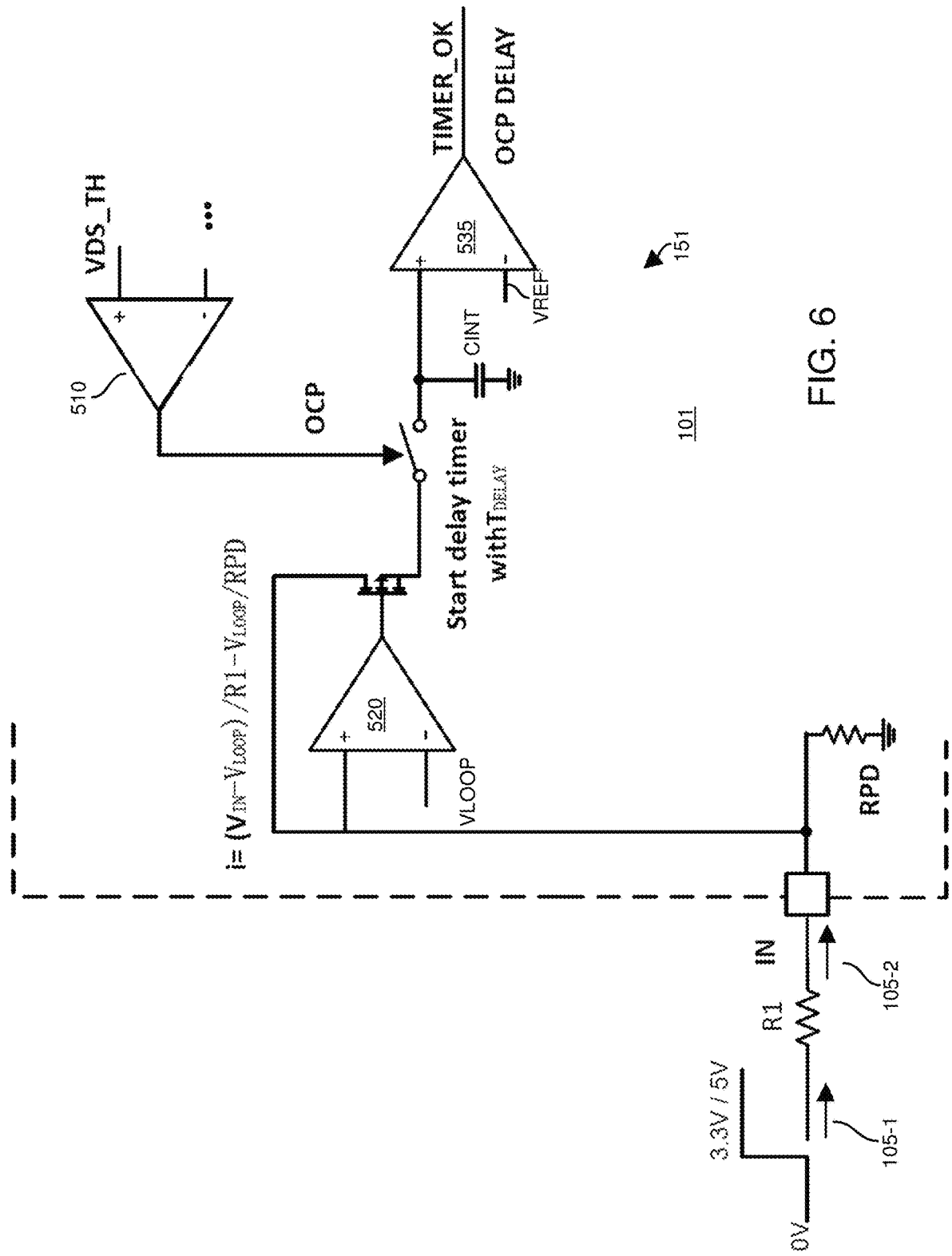
FIG. 6 is an example circuit diagram illustrating overcurrent protection delay time set up as described herein.

FIG. 6 is an example circuit diagram illustrating overcurrent protection delay time set up as described herein. More specifically, the OCP TDELAY (with no over-current protection blanking function) and device turn on diagram is shown in FIG. 6.

Vds Sensor OCP Delay Parameters Set Up-OCP Threshold Setting

The Vds voltage of switch S1 is transformed into a current flowing through R3 on ILIMIT pin of circuit 101. The gain levels and changes are set by such resistor R3 and used for sensing the current. In case a variable over-current threshold during operation is required, such variable threshold gives the customer flexibility for temperature compensation to improve the overall accuracy of the Vdson sensing and to optimize the threshold according to the operating condition (e.g. higher threshold at startup and lower threshold in normal operating conditions, or depending on MOSFET temperature).

An internal second-order RC filter (such as the glitch filter 571) may be used to reduce the ripple on the threshold. Since the recommended PULSE WIDTH MODULATION (PWM) frequency is fILIMIT=1 MHz, the corner frequency of the internal filter is set at f3 dB<10fILIMIT. The internal resistor R4 is 50 kΩ and the equation based on voltage sensing on Rdson can be calculated: VILIMIT=(VD−VS)/R4×R3

OCP Delay TDELAY Setting

The OCP delay can be flexibly set up through external resistor R1. For example, resistor R1 is selected to provide such flexible delay time and TDELAY can provide a range from 8 μS to 150 μS for users to choose. As previously discussed, resistor R1 controls a magnitude of current 505-2 charging the capacitor CINT.

The equation of TDELAY (time duration in which an over-current of the current IDS above a threshold level is allowable for a short duration of time) is as follows:

$$TDELAY = Cint*Vref/I$$

$$I = (VIN - VLOOP)/R1 - VLOOP/200 \ k\Omega$$

where Cint is internal 100 pF, VREF is typically 1.2V, VLOOP is typically 2.5V, VIN is typically 5V/3.3V, and 200 kΩ is a resistance of an RPD resistor, which is an internal resistor used to ensure proper pull-down of the IN pin in case no external components are connected. The resistance of the RPD may be large enough to limit the impact on the delay generation, but not too large for providing a safe pull-down of the IN pin.

For example, when the MCU (switch controller 140 producing control signal 105-1) input voltage on IN pin is 5V, if the value of R1 is 16 kΩ (minimum requirement defined by pin current consumption), TDELAY time would typically be 8 μS and when the R1 value is 126 kΩ, the TDELAY time is 150 μS.

Vds Fault Reset

The OCP fault may be of latched type. When the fault condition (OCP) disappears, the OFF or fault state can be reset by the disconnect switch enable IN cycle.

Figure 7:
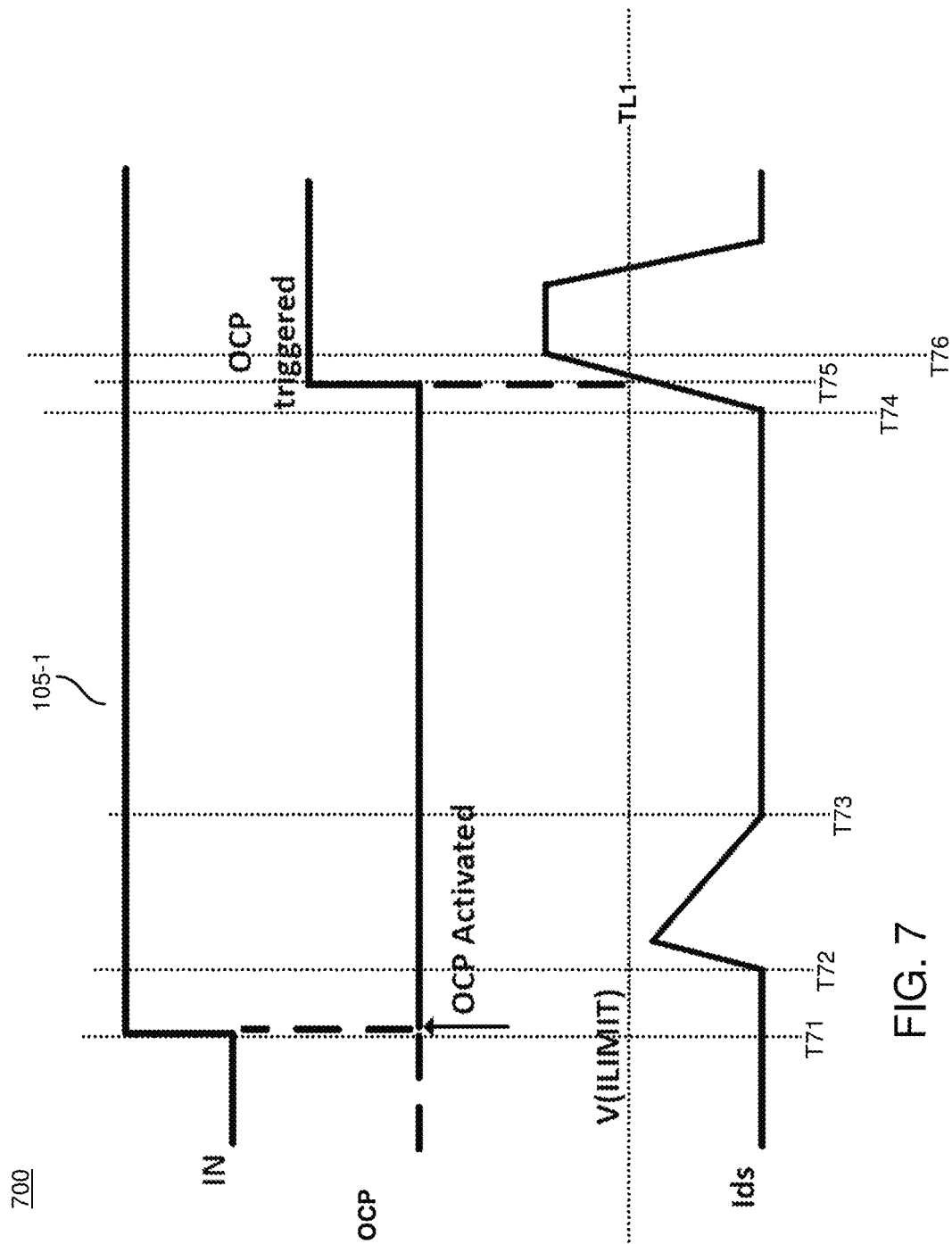
FIG. 7 is an example diagram illustrating overcurrent protection as described herein.

FIG. 7 is an example diagram illustrating overcurrent protection as described herein. More specifically, the OVER-CURRENT PROTECTION only block diagram is shown in graph 700 of FIG. 7.

1. Application of OCP Event Monitoring Only—No Over-Current Protection Blanking

Based on the pre-circuit configuration 109 in FIG. 6, note that the OCP circuitry is activated right away (time T71) once IN pin is set high with no external passive components on the pin (such as R1=zero ohms in FIG. 6) as shown in FIG. 7. In other words, the control signal 105-1 and control signal 105-2 both immediately become greater than the voltage VLOOP (because the capacitor C1 is removed from the pre-circuit configuration 109), so there is no overcurrent protection blanking function during start up implemented in FIG. 6 compared to the case of over-current protection implemented via the blanking function in FIG. 4. When an OCP event happens in FIG. 6, the OCP comparator integrates a fixed internal deglitch filter to determine when a respective overcurrent condition occurs.

More specifically, at time T71, the control signals 105-1 and 105-2 are logic high. Over-current protection in the circuit is active starting around time T71. While over-current protection is activated, between time T72 and T73, the monitored current IDS through switch S1 ramps up and down but never exceeds a threshold level TL1. Thus, no over-current protection is triggered to shut off switch S1. However, while over-current protection is activated, the monitored current IDS ramps up between time T74 and time T76. Because there is no OVER-CURRENT PROTECTION delay TDELAY, the overcurrent protection circuit detects that the magnitude of the current IDS is greater than the threshold level TL1 at time T75, which causes the overcurrent protection circuit to become activated and shut off the corresponding switch S1. Thus, shutoff of the switch S1 in FIG. 6 at time T75 results in over-current protection when the magnitude of the current IDS exceeds a threshold level TL1.

Figure 8:
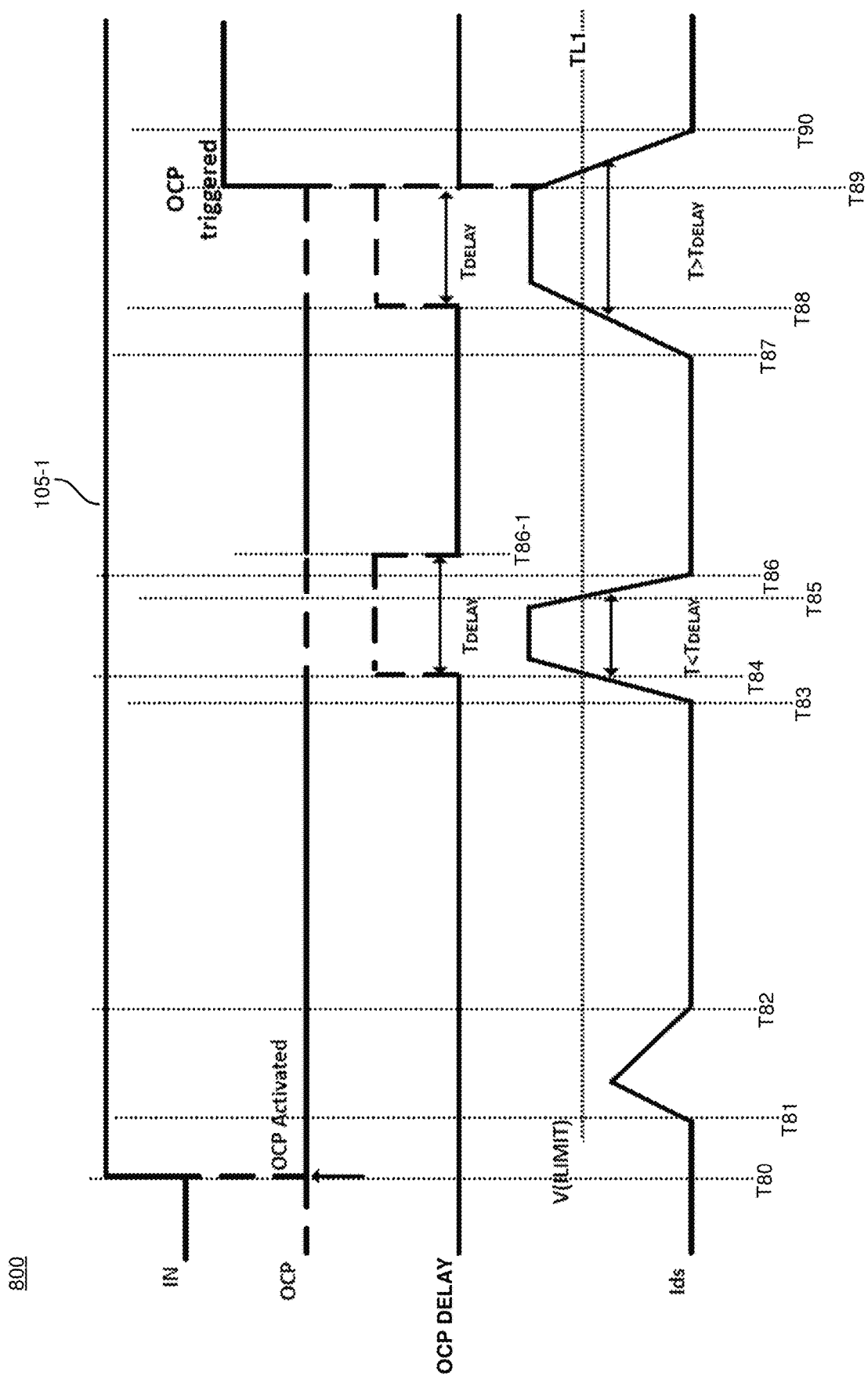
FIG. 8 is an example diagram illustrating overcurrent protection events with time delays as described herein.

FIG. 8 is an example diagram illustrating overcurrent protection events with time delays (such as OCP and additional time delay application) as described herein.

Vds Sensor with OCP Delay Application Use Case—2

2. Application of OCP and Additional Flexible Time Delay

In case a more flexible OCP time delay value TDELAY is needed and no over-current protection blanking time TBLANK is required during start up, it shall be adjusted by only setting external resistors R1, R2 (no capacitor C1 where resistor R2 is connected between node IN and ground reference potential) on IN pin (see FIG. 2 for pre-circuit configuration 109), then a programmable filter time can be inserted to avoid any OCP event being triggered within the designed time. When IN is enabled or set high, OCP will be activated right away as there is blanking time inserted to delay its activation. Then the delay time TDELAY should be calculated as the time an over current condition is allowed in the switch S1. Any overcurrent condition will not result in a fault (i.e., switch S1 off) unless it is true for more than this configured filter time. After this defined OCP filter time, and if the OCP event still exists, the OCP fault is triggered to turn off the disconnect MOSFET (switch S1) and the circuit 101 is latched until IN cycles again.

Thus, as shown in FIG. 8, at time T80, the control signal 105-1 and control signal 105-2 go logic high so that over-current protection is immediately enabled at time T80 (TBLANK=0).

Between time T81 and time T82, the current IDS ramps up but does not exceed the a threshold level TL1. Thus, the over-current protection does not trip and shutoff switch S1.

At time T84, the magnitude of the current IDS crosses the threshold level TL1. In such an instance, the over-current protection delay from comparator 535 goes logic high. The magnitude of the current IDS falls below the threshold level TL1 at time T85 prior to the end of the Tdelay at time T86-1. Thus, the over-current protection circuit does not shut off switch S1.

Additionally, at time T88, the magnitude of the current IDS crosses the threshold level TL1. In such an instance, the over-current protection delay from comparator 535 goes logic high. The magnitude of the current IDS does not fall below the threshold level TL1 before time T89 (end of TDELAY). Thus, the over-current protection circuit does shut off switch S1 at time T89 because the magnitude of the current IDS was greater than the threshold level TL1 for more than time duration TDELAY.

Figure 9:
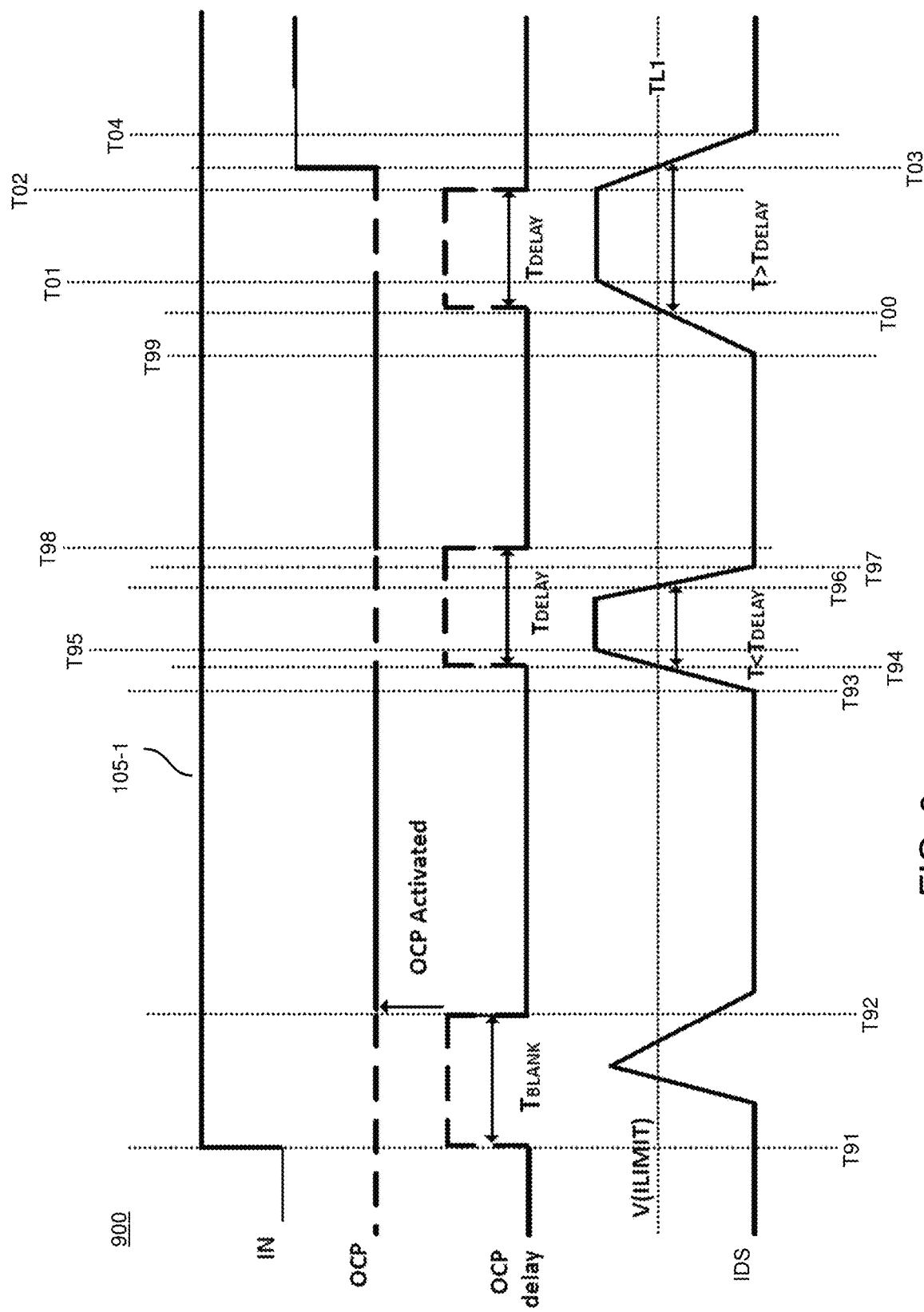
FIG. 9 is an example diagram illustrating overcurrent protection events at startup blanking time delay application as described herein.

FIG. 9 is an example diagram illustrating overcurrent protection events at startup blanking time delay application as described herein. For example, the OCP blanking during start-up, fault condition, and additional time delay application block diagram is shown in FIG. 9.

Vds Sensor With OCP Delay and Blanking Application Use Case—3 & 4

3. Application of OCP Blanking and OCP and Additional Flexible Time Delay

In the applications of Vds sense, there are cases that need full features of protection including OVER-CURRENT PROTECTION blanking TBLANK during switching on event, OCP and additional filter time delay when fully on. With extra resistor R2 and capacitor C1 combined with R1 on IN pin (such as in FIGS. 1 and 5), the pre-circuit configuration 109 can be used to select start-up OCP blanking times (ignore over-current conditions at start up) as well, with proper selection of capacitor C1 and R1, implement blanking time (ignore over-current for a time duration TDELAY) can be widely chosen from μS to mS range. After the above-described blanking time TB LANK, then OCP is armed immediately thereafter. If an over-current event is triggered, an internal timer determining the additional filter time (TDELAY) starts. As previously discussed, the delay (time duration TDELAY) can be programmed by the customer through the static resistors R1 and R2. In general, the system is forcing a voltage on the IN pin. According to the values of R1, the voltage across the R1 will determine the amount of time for the total OCP delay. The external diode D1 allows the system to ensure turn off is fast enough.

Thus, as shown in graph 900, at time T91, the control signal 105-1 goes logic high. As previously discussed, the filtering provided by pre-circuit configuration 109 delays the control signal 105-2 from raising above a threshold level VTHBLANK. Thus, over-current protection is disabled between time T91 and T92.

Between time T91 and time T92 (TBLANK), the current IDS ramps up and exceeds the threshold level TL1. Because the overcurrent protection circuitry is disabled during the TBLANK time as previously discussed, the overcurrent protection circuitry of circuit 101 does not deactivate the switch S1.

At time T94, the magnitude of the current IDS crosses the threshold level TL1. In such an instance, the over-current protection delay (OCP DELAY signal) from comparator 535 goes logic high. The magnitude of the current IDS falls below the threshold level TL1 at time T96 prior to the end of the Tdelay at time T98. Thus, the TDELAY prevents the over-current protection circuit from shutting off switch S1.

Additionally, at time TOO, the magnitude of the current IDS crosses the threshold level TL1. In such an instance, the over-current protection delay from comparator 535 goes logic high. The magnitude of the current IDS does not fall below the threshold level TL1 before time T02 (end of TDELAY started at time T00). Thus, the over-current protection circuit does shut off switch S1 at time T03 because the magnitude of the current IDS was greater than the threshold level TL1 for more than time duration Tdelay.

Thus, pre-circuit configuration 109 controls both the implementation and durations of TDELAY and TBLANK.

4. Application of OCP Deactivation

To disable Vds OCP and delay function, the pin ILIMIT can be shorted to GND. The device detects the condition and turns off the VDSon sensing and OCP circuitry.

Figure 10:
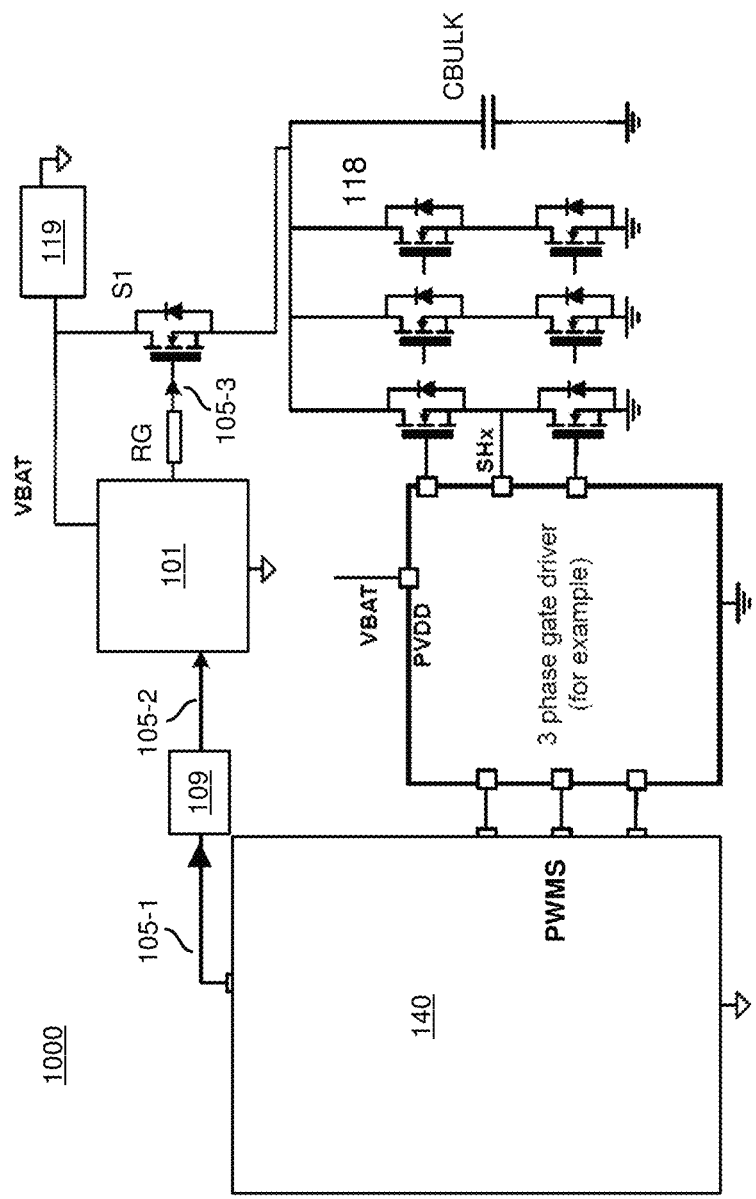
FIG. 10 is an example diagram illustrating implementation of the multifunction control circuit in a battery power application as described herein.

FIG. 10 is an example diagram illustrating implementation of the multifunction control circuit in a battery power application (system 1000) as described herein.

When IN is pulled down, the gate of switch S1 is turned off. When Vgs_th_off is reached, the circuit (a.k.a., IC) is powered down only after the gate voltage goes below Vgs_th_off.

When the IN pin 2 is pulled down to turn off the disconnect switch S1, the power supply of the device is as well switched off. In order to allow a proper switch off of the switch S1, the power supply of the circuit 101 must be maintained alive to ensure all circuits are able to pull down safely. In order to achieve this, a 'Safe-Switch-Off' mechanism is designed in the gate driver.

Safe-Switch-Off works as follows:
1. When IN is pulled down, pin GATE will start discharging the disconnect MOSFET. Hence, VGS voltage will start dropping.
2. Once the VGS voltage reaches the VGS_SAFE_OFF_THR threshold, the device is powered down.
3. To initiate a new power-up sequence, pin IN must be switched ON again.

VIN UVLO (Under-Voltage Lockout)

The circuit 101 circuit board provided with supply voltage UVLO circuit. This is referred to as VIN UVLO. The main function of VIN UVLO is to monitor the VIN voltage. Even if VIN is low and the conditions are known, the chip is behaving in an uncontrolled manner, therefore exposing the system to hazardous behaviors. The VIN UVLO works in the following way:

if VIN voltage is below the UVLO threshold falling (VVIN_UVLO_F), the VIN UVLO will be asserted. This will switch off the disconnect MOSFET. The gate driver is disabled. To restart the operation, the device needs to cycle IN pin when the VIN voltage is above the UVLO rising threshold.

if VIN voltage is above the UVLO threshold rising (VVIN_UVLO_R), the VIN UVLO will be released allowing normal operation of the device.

The UVLO circuitry integrates a hysteresis (VVIN_UVLO_R-VVIN_UVLO_F) to avoid malfunctions for example during start up.

Figure 11:
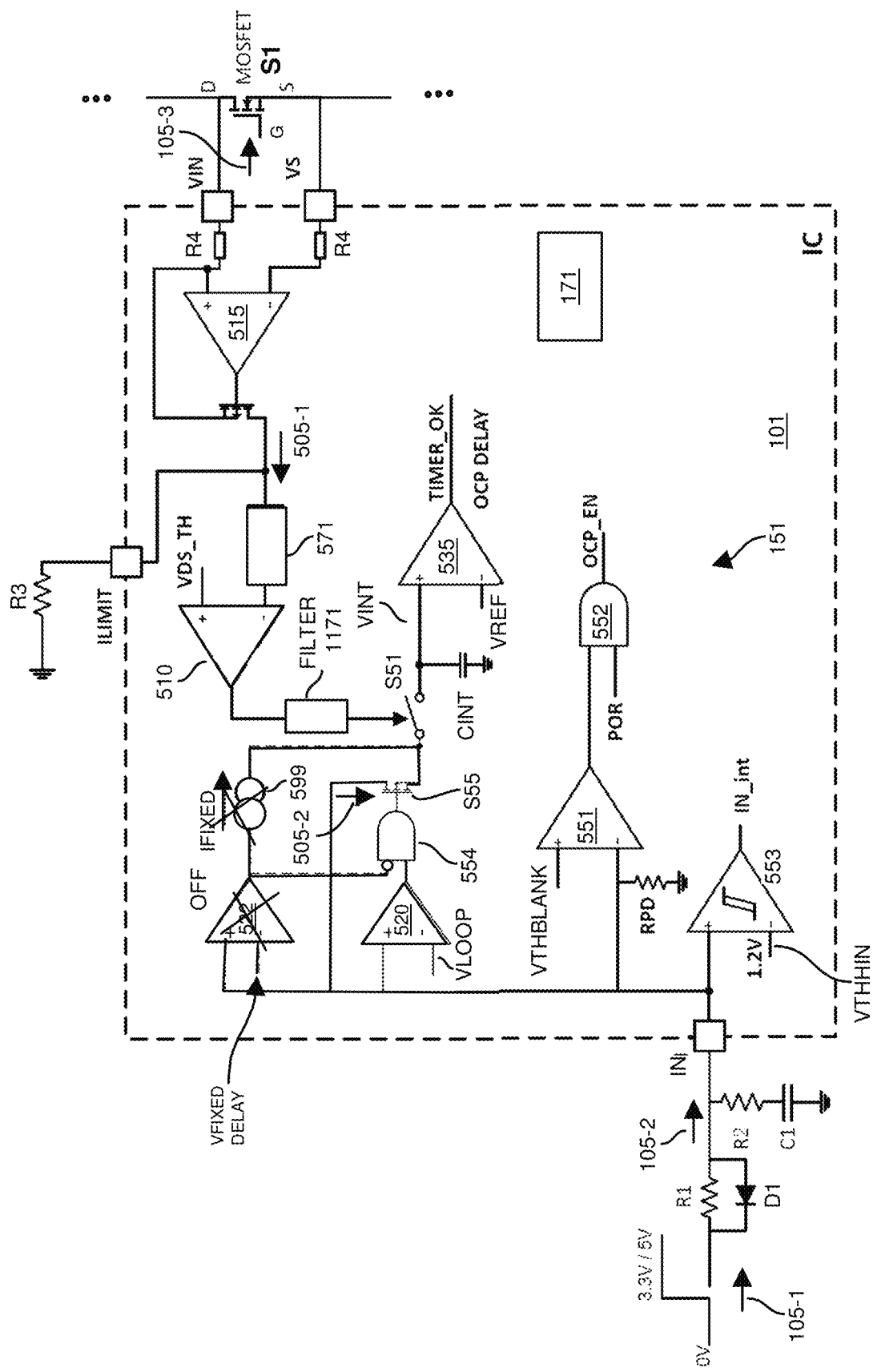
FIG. 11 is an example diagram illustrating implementation of a pre-circuit configuration network (such as resistors, capacitor, diode) to implement overcurrent protection in a respective multifunction control circuit as described herein.

The circuit 101 may be provided as well with VGS voltage monitoring. This integrated circuit allows observing the gate to source voltage of the disconnect switch. This function is used to detect possible errors in PCB manufacturing like a shorted gate or possible failures that happen during the lifetime of the product that could lead to the loss of connection between the gate driver pins and the gate of the MOSFET. In order to support this use case, the VGS voltage is internally compared against a threshold voltage (VGS_UVLO_TH). This feature works in the following way:

1. When the disconnect MOSFET is commanded to turn on, the gate driver starts charging the gate of the MOSFET S1 increasing the Vgs voltage.
2. While the Vgs voltage increases,
   If Vgs voltage reaches VGS_UVLO_TH threshold, that means the gate is charged properly.
   Otherwise, with given customized blanking time, if VGS voltage is not reached VGS_UVLO_TH threshold voltage, then the device triggers a fault. To restart the device (i.e., switch control circuit 101), an IN cycle is required The UVLO circuitry integrates a Falling Threshold VGS_SAFE_OFF_THR to make sure gate voltage is safely turned off during switching off event FIG. 11 is an example diagram illustrating implementation of a pre-circuit configuration network (such as resistors, capacitor, diode) to implement overcurrent protection in a respective multifunction control circuit as described herein.

In this example, the final voltage of control signal 105-2 after settling (due to RC filtering) is less than the threshold value VFIXED DELAY. In such an instance, current source 599 is OFF. the current 505-2 through switch S55 charges capacitor CINT when the switch S51 is closed during an output current condition of current IDS greater than the threshold level TL1 (output of comparator 510 turns on switch S51). In a manner as previously discussed, a magnitude of the current 505-2 is controlled via resistor R1. For example, current 505-2 equals (Vin-VLOOP)/R1, where VIN is a high state of control signal 105-1 such as 3.3 VDC, 5 VDC, etc. Thus, the value of the resistor R1 controls the magnitude of TDELAY (a.k.a., OCP DELAY). Thus, as previously discussed, the circuit 101 as discussed herein includes a capacitor CINT that is charged via current received through the input pin and resistor R1, storing a voltage VINT on capacitor CINT; the comparator 535 compares a magnitude of the voltage VINT stored in the capacitor CINT to a threshold value VREF. The output of the comparator 535 controls the TDELAY function associated with the circuit 101.

Figure 12:
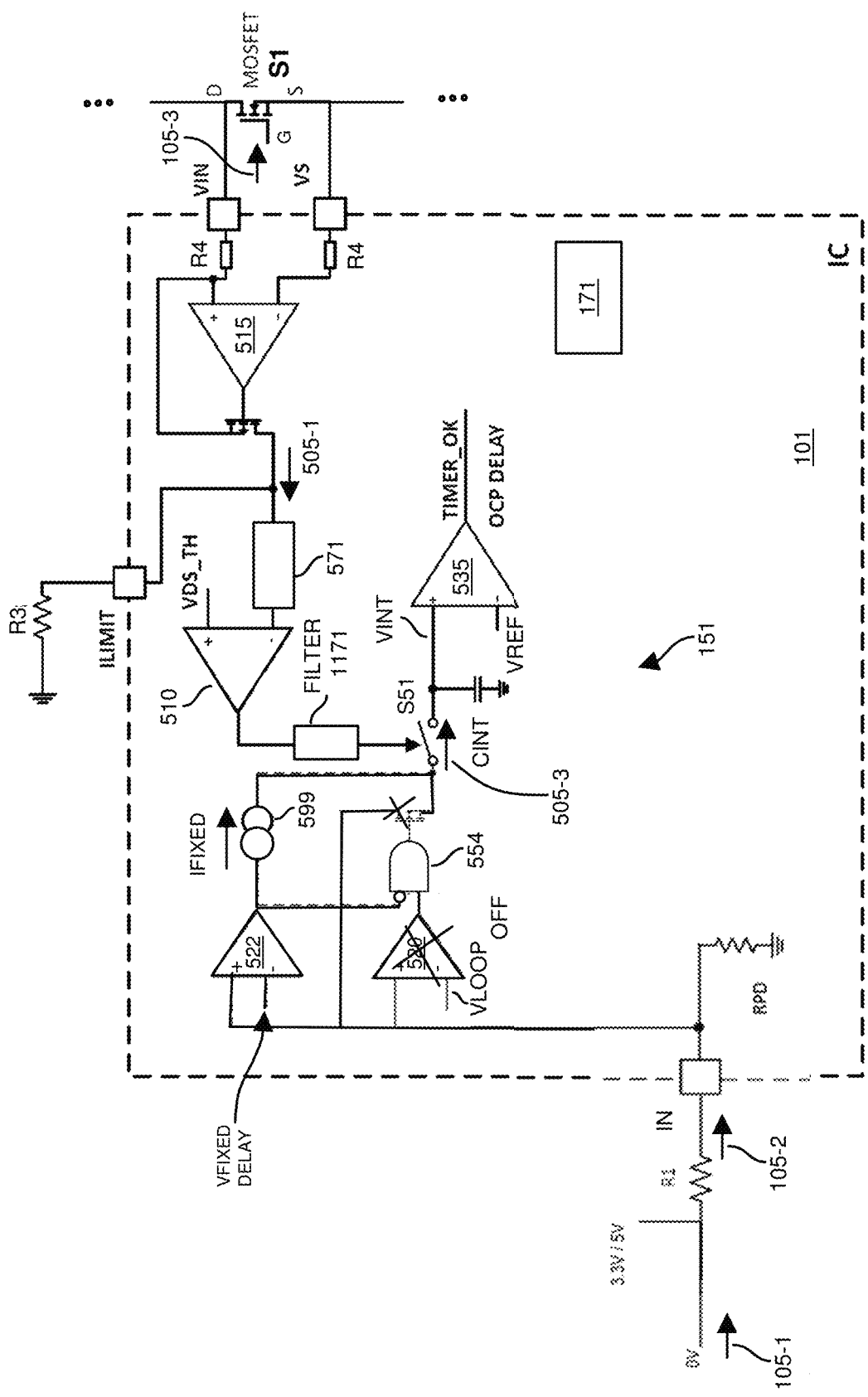
FIG. 12 is an example diagram illustrating implementation of a pre-circuit configuration (such as a single external resistor) to implement overcurrent protection in a respective multifunction control circuit as described herein.

FIG. 12 is an example diagram illustrating implementation of a pre-circuit configuration (such as a resistor) to implement overcurrent protection in a respective multifunction control circuit as described herein.

In this example, the final voltage of control signal 105-2 after turn ON (low to high transition) is greater than the threshold value VFIXED DELAY. In such an instance, the current source is ON producing a constant current IFIXED. The AND gate controls switch S55 to an OFF-state. The resistor R1 no longer controls charging of capacitor CINT and corresponding time duration TDELAY. The current 505-3 (IFIXED from constant current source 599) charges capacitor CINT at a known rate when the switch S51 is closed due to a detected over-current condition of current IDS greater than the threshold level TL1. TDELAY is a present default value controlled by a magnitude of the current IFIXED. Thus, the resistor R1 can be set to zero ohms or other suitable value such that the control signal 105-2 is greater than the voltage VFIXED DELAY to select a default TDELAY value as controlled by the current source 599 charging the capacitor CINT.

Figure 13:
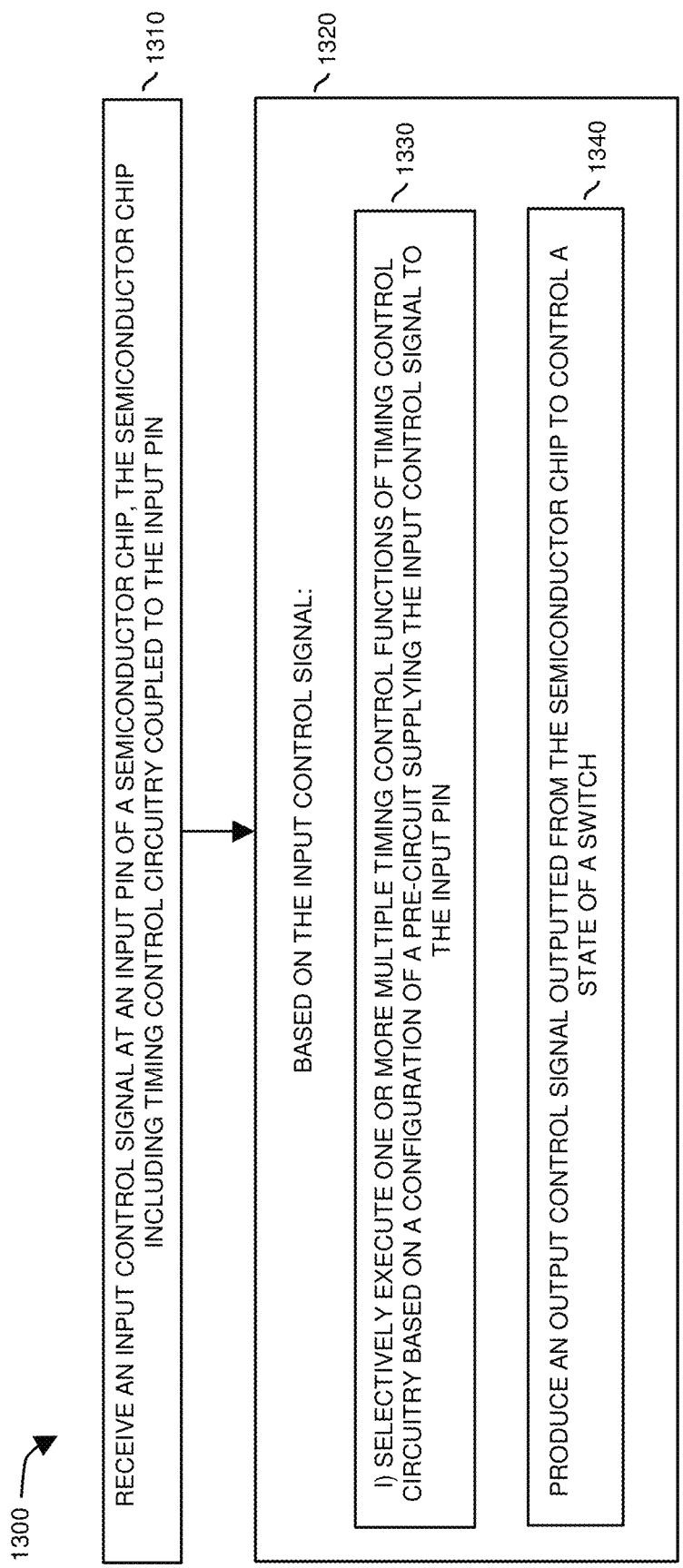
FIG. 13 is an example diagram illustrating a general method as described herein.

FIG. 13 is a flowchart 1300 illustrating an example method as discussed herein. Note that there will be some overlap with respect to concepts as discussed above.

In processing operation 1310, the controller 140 receives an input control signal at an input pin of a semiconductor chip (such as circuit 101), the semiconductor chip including timing control circuitry coupled to the input pin.

In processing operation 1320, based on the input control signal, the circuit 101 (such as a switch controller): i) selectively execute one or more multiple timing control functions of timing control circuitry (or timing control functions) based on a configuration of a pre-circuit configuration 109 (i.e., pre-circuit) supplying the input control signal to the input pin via sub-processing operation 1330, and ii) produce an output control signal outputted from the semiconductor chip to control a state of a switch via sub-processing operation 1340.

Note again that techniques herein are well suited for use in power supply applications. However, it should be noted that the disclosure of matter herein is not limited to use in such applications and that the techniques discussed herein are well suited for other applications as well.

While this invention has been particularly shown and described with references to preferred aspects thereof, it will be understood by those skilled in the art that various changes in form and details may be made therein without departing from the spirit and scope of the present application as defined by the appended claims. Such variations are intended to be covered by the scope of this present application. As such, the foregoing description in the present disclosure is not intended to be limiting. Rather, any limitations to the invention are presented in the following claims.

The invention claimed is:

1. An apparatus comprising:
an input pin operative to receive an input control signal;
an output pin operative to output an output control signal based on the received input control signal;
timing control circuitry coupled to the input pin, the timing control circuitry operative to selectively apply one or more timing control functions associated with conversion of the input control signal into the output control signal based on a setting of one or more hardware components disposed in a pre-circuit coupled to the input pin, the one or more hardware components in the pre-circuit being disposed external to the apparatus; and
wherein the one or more timing control functions include:
a first timing control function operative to provide control based on a magnitude of a voltage supplied by the setting of one or more hardware components disposed in the pre-circuit coupled to the input pin, and a second timing control function operative to provide control based on a magnitude of first current supplied from the setting of one or more hardware components through the input pin.

2. The apparatus as in claim 1 further comprising:
switch control circuitry operative to output the output control signal from the output pin to control, based on the selectively executed one or more timing control functions, a switch disposed external to the apparatus.

3. The apparatus as in claim 1, wherein the apparatus is a semiconductor chip operative to control a state of a switch based on the control input received through the input pin, the switch disposed external to the apparatus.

4. The apparatus as in claim 1, wherein the timing control circuitry is operative to execute the one or more timing control functions to control an external circuit with respect to the apparatus based on an input signal applied to the pre-circuit.

5. The apparatus as in claim 1, wherein the first timing control function is operative to control a duration of deactivation of an over-current protection circuit disposed in the apparatus.

6. The apparatus as in claim 5, wherein the second timing control function is operative to control a time duration in which a magnitude of second current through a switch is permitted to be above an over-current threshold level without the over-current protection circuit initiating deactivation of the switch.

7. The apparatus as in claim 6, wherein the timing control circuitry is operative to implement fixed charging of a capacitor via constant current as a default to control the time duration in which the magnitude of second current through a switch is permitted to be above the over-current threshold level without an over-current protection circuit initiating deactivation of the switch.

8. The apparatus as in claim 1, wherein the setting of one or more hardware components includes a resistor, the resistor controlling a magnitude of current inputted to the input pin.

9. The apparatus as in claim 1, wherein the setting of one or more hardware components includes a diode in which to discharge a voltage at the input pin and turn off a timing control function.

10. The apparatus as in claim 1 further comprising:
a switch driver to control a switch via the output control signal, the switch disposed external to the apparatus;
a first comparator operative to control the first timing control function of the one or more timing control functions, the first timing control function operative to control disabling of over-current protection associated with driving the switch via the switch driver in accordance with a first threshold value inputted to the first comparator; and
a second comparator operative to control the second timing control function of the one or more timing control functions, the second timing control function operative to control disabling of over-current protection associated with driving the switch via the switch driver in accordance with a second threshold value inputted to the second comparator.

11. The apparatus as in claim 10, wherein the first timing control function is operative to control disabling of the over-current protection at startup; and
wherein the second timing control function controls a time duration in which the magnitude of current through the switch is permitted to be above an over-current threshold level without over-current protection circuitry in the switch driver deactivating the switch subsequent to the startup.

12. An assembly comprising:
a substrate;
the apparatus and the one or more hardware components of claim 1 disposed on the substrate.

13. The apparatus as in claim 1, wherein the input control signal is a second input control signal;
wherein the pre-circuit is operative to receive a first input control signal from a controller; and
wherein the pre-circuit is operative to convert the received first input control signal into the second input control signal supplied to the input pin.

14. The apparatus as in claim 13, wherein the one or more hardware components includes a first resistor disposed in series between the controller and the input pin; and
  wherein the selective application of the one or more timing control functions associated with conversion of the second input control signal into the output control signal is based on a selected magnitude of resistance of the first resistor.

15. The apparatus as in claim 14, wherein the one or more hardware components includes a second resistor disposed in series with the first resistor; and
  wherein the selective application of the one or more timing control functions associated with conversion of the second input control signal into the output control signal is based on a selected magnitude of resistance of the second resistor.

16. An apparatus comprising:
  an input pin operative to receive an input control signal;
  an output pin operative to output an output control signal based on the received input control signal; and
  timing control circuitry coupled to the input pin, the timing control circuitry operative to selectively apply one or more timing control functions associated with conversion of the input control signal into the output control signal based on a setting of one or more hardware components disposed in a pre-circuit coupled to the input pin, the one or more hardware components in the pre-circuit being disposed external to the apparatus;
  wherein the timing control circuitry includes:
    a capacitor that is charged via current received through the input pin, the capacitor storing a voltage; and
    a comparator operative to compare a magnitude of the voltage stored in the capacitor to a threshold value, the output of the comparator operative to control at least one of the timing control functions.

17. The apparatus as in claim 16, wherein the capacitor is charged during a condition in which an over-current protection provided by the apparatus is disabled, a magnitude of the current received through the input pin being defined by the external setting of one or more hardware components.

18. An apparatus comprising:
  an input pin operative to receive an input control signal;
  an output pin operative to output an output control signal based on the received input control signal; and
  timing control circuitry coupled to the input pin, the timing control circuitry operative to selectively apply one or more timing control functions associated with conversion of the input control signal into the output control signal based on a setting of one or more hardware components disposed in a pre-circuit coupled to the input pin, the one or more hardware components in the pre-circuit being disposed external to the apparatus;
  wherein a first timing control function of the one or more timing control functions monitors a magnitude of voltage of the input control signal received from the setting of one or more hardware components at the input pin, the first timing control function operative to:
  i) enable operation of controlling a switch via the output control signal in response to detecting a first condition in which a magnitude of the input control signal crosses a first threshold value; and
  ii) disable activation of an over-current protection circuit in the apparatus between a first instance of detecting the first condition and detecting that the magnitude of the input control signal crosses a second threshold value.

19. A switch control assembly comprising:
  a pre-circuit operative to convert a first input control signal into a second input control signal, the pre-circuit including a first circuit component;
  a switch driver circuit including: i) an input pin to receive the second input control signal from the pre-circuit, ii) an output pin to drive a switch with an output control signal based on the second input control signal, and iii) timing control circuitry supporting timing control functions, the timing control circuitry operative to selectively apply at least one of the timing control functions associated with generation of the output control signal based on a respective setting of the first circuit component in the pre-circuit, the pre-circuit directly coupled to the input pin; and
  wherein the pre-circuit includes a diode in parallel with the first circuit component, the diode operative to discharge the input pin.

20. The switch control assembly as in claim 19, wherein the first circuit component is a first resistor;
  wherein the pre-circuit includes a series circuit path including the first resistor, a second resistor, and a capacitor disposed in series;
  wherein a controller inputs the first input control signal to the series circuit path, the first input control signal controlling operation of the switch; and
  wherein a node coupling the first resistor to the second resistor in the pre-circuit is operative to supply the second input control signal to the input pin of the switch driver circuit.

21. The switch control assembly as in claim 20, wherein settings of the first resistor, the second resistor, and the capacitor control a first time duration of deactivating an over-current protection circuit implemented by the switch driver circuit to control a magnitude of current through the switch; and
  wherein a respective setting of the first resistor controls a second time duration in which the magnitude of current through the switch is permitted to be above an over-current threshold level without the switch driver circuit deactivating the switch.

22. The switch control assembly as in claim 19 further comprising:
  a capacitor;
  a comparator;
  wherein the first circuit component is a first resistor;
  wherein the pre-circuit includes:
    a circuit path including the first resistor disposed between a controller and the input pin, the controller operative to input the first input control signal to the first resistor, the first input control signal operative to control the switch; and
    wherein a respective setting of the first resistor controls a flow of current supplied through the input pin to the capacitor, a voltage stored in the capacitor ramping based on the flow of current through the first resistor, the comparator comparing the voltage to a threshold voltage to determine a time duration in which the magnitude of current through the switch is permitted to be above an over-current threshold level without over-current protection circuitry deactivating the switch.

23. The switch control assembly as in claim 19, wherein the first circuit component is a first resistor;
  wherein the respective setting of the first circuit component is a first resistance; and wherein the first input control signal is generated by a controller to control the switch, a magnitude of the first resistance operative to control the applied at least one of the timing control functions associated with generation of the output control signal.

24. The switch control assembly as in claim 23, wherein the first resistor is disposed in series between the controller and the input pin of the switch driver circuitry, the magnitude of the first resistance operative to control a magnitude of current supplied by the second input control signal into the input pin of the switch driver circuitry.

25. A method comprising:
receiving an input control signal at an input pin of a semiconductor chip, the semiconductor chip including timing control circuitry coupled to the input pin, the timing control circuitry configured to support multiple timing functions depending upon selection of a resistance of a first resistor disposed in a pre-circuit directly coupled to the input pin of the semiconductor chip;
based on the input control signal: i) selectively executing at least one of the multiple timing control functions of the timing control circuitry based on the resistance of the first resistor in the pre-circuit supplying the input control signal to the input pin, and ii) producing an output control signal outputted from the semiconductor chip to control a state of a switch;
wherein the input control signal is a second input control signal;
wherein the pre-circuit including the first resistor is operative to receive a first input control signal from a controller; and
wherein the pre-circuit is operative to convert the first input control signal into the second input control signal supplied to the input pin of the semiconductor chip.

26. The method as in claim 25, wherein the first resistor is disposed in series between the controller and the input pin of the semiconductor chip.

27. The method as in claim 25, wherein the pre-circuit further includes a second resistor; and
wherein the selection of executing the at least one of the multiple timing control functions is based on a combination of a resistance of the first resistor and a resistance of the second resistor.

28. An apparatus comprising:
an input pin operative to receive an input control signal;
an output pin operative to output an output control signal based on the received input control signal; and
timing control circuitry coupled to the input pin, the timing control circuitry operative to selectively apply one or more timing control functions associated with conversion of the input control signal into the output control signal based on a setting of one or more hardware components disposed in a pre-circuit coupled to the input pin, the one or more hardware components in the pre-circuit being disposed external to the apparatus;
wherein the one or more timing control functions include a first over-current protection timing control function and a second over-current protection timing control function;
wherein the first over-current protection timing control function is operative to control a first time delay of triggering a first overcurrent condition associated with producing the output control signal; and
wherein the second over-current protection timing control function is operative to control a second time delay of triggering a second overcurrent condition associated with producing the output control signal.

29. The apparatus as in claim 28, wherein the setting of the one or more hardware components disposed in the pre-circuit is operative to control a magnitude of the first time delay and a magnitude of the second delay.

* * * * *